(12) United States Patent
Huang

(10) Patent No.: US 6,744,653 B1
(45) Date of Patent: Jun. 1, 2004

(54) CAM CELLS AND DIFFERENTIAL SENSE CIRCUITS FOR CONTENT ADDRESSABLE MEMORY (CAM)

(76) Inventor: Xiaohua Huang, 12897 Regan La., Saratoga, CA (US) 95070

( * ) Notice: Subject to any disclaimer, the term of this patent is extended or adjusted under 35 U.S.C. 154(b) by 22 days.

(21) Appl. No.: 10/202,621

(22) Filed: Jul. 24, 2002

Related U.S. Application Data

(60) Provisional application No. 60/327,049, filed on Oct. 4, 2001.

(51) Int. Cl.[7] .............................................. G11C 15/00
(52) U.S. Cl. ........................... 365/49; 365/207; 365/210
(58) Field of Search ........................... 365/49, 207, 210; 711/108

(56) References Cited

U.S. PATENT DOCUMENTS

| | | | | |
|---|---|---|---|---|
| 5,162,681 A | * | 11/1992 | Lee | 327/53 |
| 5,446,686 A | * | 8/1995 | Bosnyak et al. | 365/49 |
| 5,598,115 A | * | 1/1997 | Holst | 326/119 |
| 6,195,277 B1 | * | 2/2001 | Sywyk et al. | 365/49 |
| 6,307,798 B1 | * | 10/2001 | Ahmed et al. | 365/207 |
| 6,442,054 B1 | * | 8/2002 | Evans et al. | 365/49 |

* cited by examiner

*Primary Examiner*—Richard Elms
*Assistant Examiner*—J. H. Hur
(74) *Attorney, Agent, or Firm*—Dinh & Associates

(57) ABSTRACT

A dummy content-addressable memory (CAM) cell and a dummy ternary CAM cell are connected to each row in a CAM and a ternary CAM array, respectively, to enable a differential match line sensing based on the content stored. The ternary CAM cell is for a differential match line sensing in low power applications. A method includes generating a voltage difference between a match line signal and a reference line signal, and then detecting and amplifying the voltage difference to determine a match or a mismatch.

17 Claims, 18 Drawing Sheets

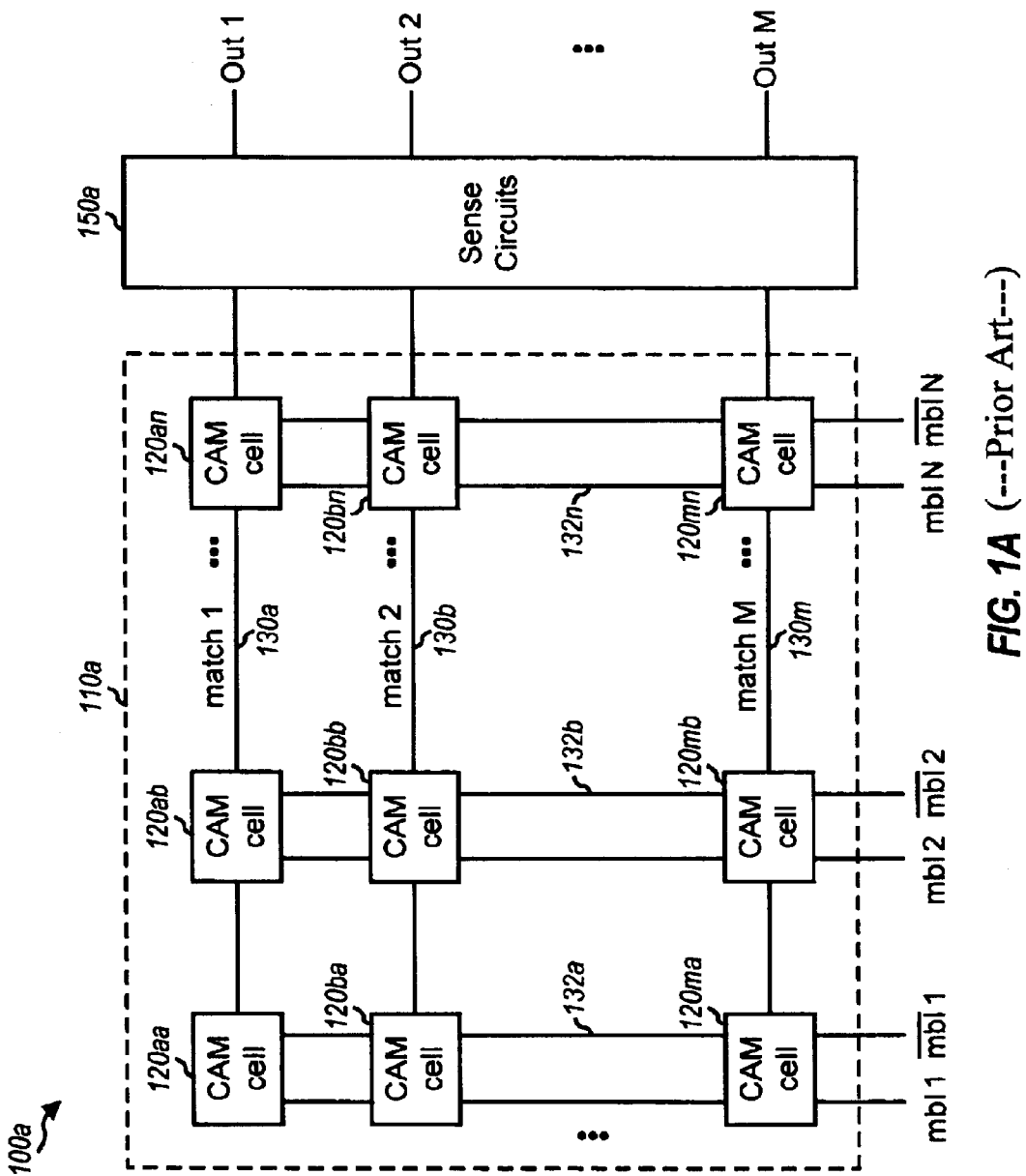
FIG. 1A (---Prior Art---)

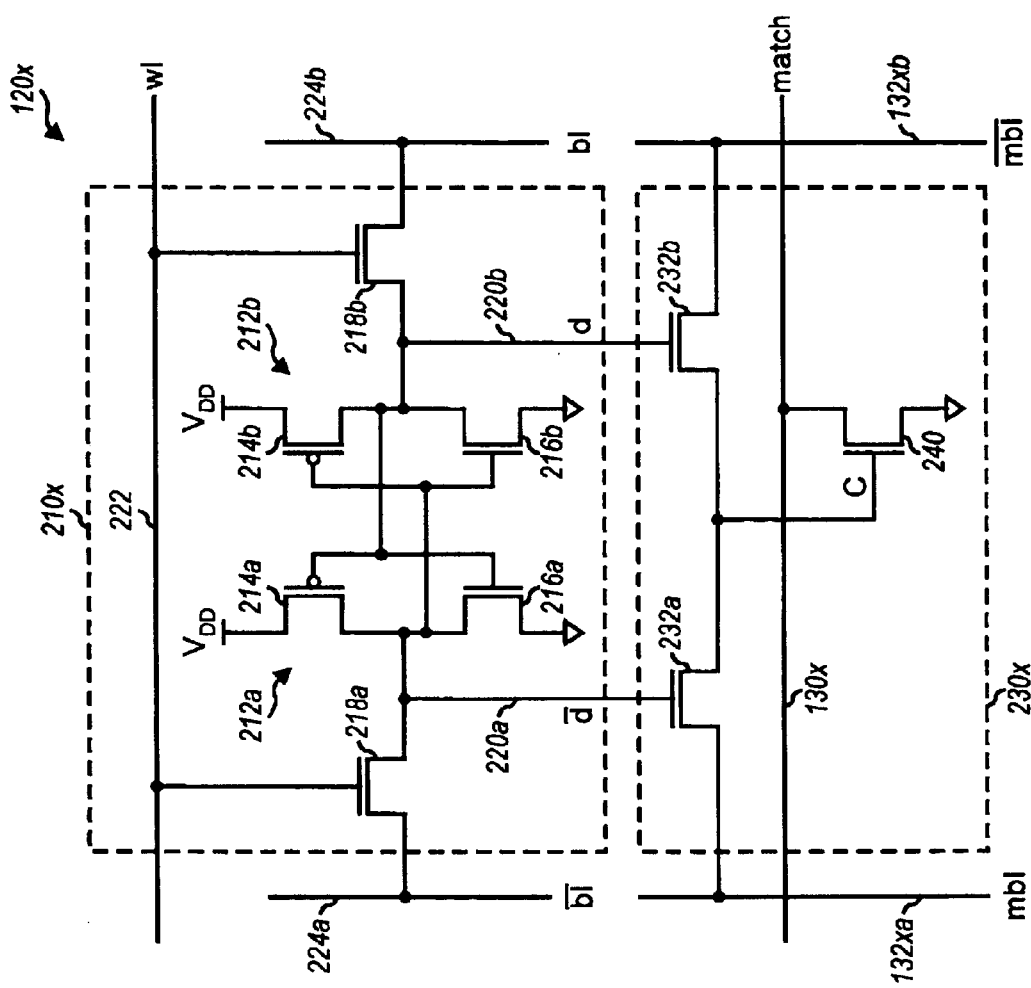
*FIG. 2B* (---Prior Art---)
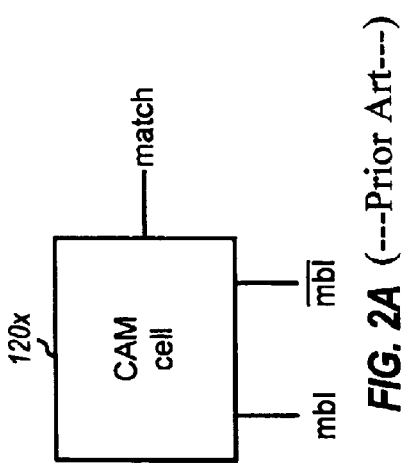
*FIG. 2A* (---Prior Art---)
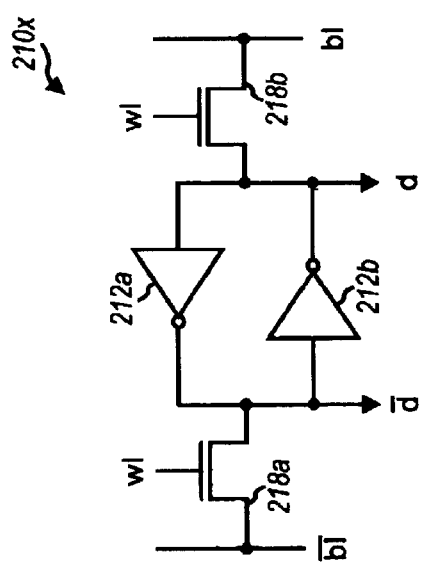
*FIG. 2C* (---Prior Art---)

CAM CELLS AND DIFFERENTIAL SENSE CIRCUITS FOR CONTENT ADDRESSABLE MEMORY (CAM)

This application claims the benefit of provisional U.S. Application Serial No. 60/327,049, entitled "High-Speed and Low Power Content Addressable Memory (CAM) Sensing Circuits," filed Oct. 4, 2001, which is incorporated herein by reference in its entirety for all purposes.

BACKGROUND OF THE INVENTION

The present invention relates generally to semiconductor circuits, and more specifically to CAM cells and high speed and low power sense circuits for content addressable memory.

A content addressable memory (CAM) is a memory having an array of memory cells that can be commanded to compare all or a subset of the "entries" in the array against an input address. Each entry in the CAM array corresponds to the content of the cells in a particular row of the array. Each row of the array is further associated with a respective match line, which is used as a status line for the row. All or a portion of the CAM array may be compared in parallel to determine whether or not the input address matches any of the entries in the portion selected for comparison. If there is a match to an entry, then the match line for the corresponding row is asserted to indicate the match. Otherwise, the match line is de-asserted to indicate a mismatch (which may also be referred to as a "miss"). Typically, any number of match lines may be asserted, depending on the entries in the array and the input address.

In a typical CAM design, the comparison between a bit of the input address and the content of a CAM cell is performed by a comparison circuit included in the cell. The comparison circuits for all cells in each row may then be coupled to the match line for the row. For simplicity, the comparison circuits may be designed such that a wired-OR operation is implemented for the outputs from all comparison circuits coupled to any given match line. In one common design, the output for each comparison circuit is formed by the drain of an N-channel output transistor. This output transistor is turned ON if there is a mismatch between the input address bit and the memory cell content and is turned OFF otherwise. The match line may be pre-charged to a logic high prior to each comparison operation, and would thereafter remains at logic high only if all output transistors for the row are turned OFF, which would be the case if there is a match between all bits of the entry for the row and the input address. Otherwise, if at least one output transistor is turned ON due to a mismatch, then the match line would be pulled low by these transistors. The signal (or voltage) on the match line may thereafter be sensed or detected to determine whether or not there was a match for that row.

The conventional CAM cell and CAM sensing mechanism described above, though simple in design, have several drawbacks that affect performance. First, speed may be limited by the wired-OR design of the match line, if some speed-enhancing techniques are not employed. Each row may include a large number of cells (e.g., possibly 100 or more cells). In this case, if only one bit in the entire row does not match, then only one output transistor will be turned ON and this transistor will need to pull the entire match line low (e.g., from $V_{DD}$ to $V_{SS}$). A long time (i.e., $t = C \cdot V_{DD}^2/I$, where C is the capacitance of each entire match line and I is the current of each transistor) may then be required to discharge the line, which would then limit the speed at which the CAM array may be operated. Second, excessive power may be consumed by the CAM design described above. Typically, only one row will match the input address, and all other rows will not match. In this case, all but one match line will be pulled to logic low (e.g., to $V_{SS}$) by the output transistors that are turned ON due to mismatches. The power consumed may then be computed as $(M-1) \cdot C \cdot V^{DD2}$, where $(M-1)$ is the number of mismatched rows, C is the capacitance of each match line, and $V_{DD}$ is the voltage swing of the match line during discharge.

As can be seen, there is a need for CAM cells and sense circuits that can ameliorate the shortcomings related to speed and power in the conventional design.

SUMMARY OF THE INVENTION

The invention provides CAM cell designs having improved performance over a conventional design. The invention further provides techniques to detect the signal (or voltage) on a match line coupled to a number of CAM cells and having faster speed of operation and possibly lower power consumption.

In an aspect, a content addressable memory (CAM) cell is provided having improved performance. The CAM cell includes a memory cell operable to store a bit value and a comparison circuit configured to detect the bit value stored in the memory cell. The comparison circuit includes (1) an output transistor coupled to a match line and configured to provide a drive for the match line based on the detected bit value, and (2) a dummy transistor coupled to a dummy line. The match line and dummy line are used to detect an output value provided by the CAM cell. In an embodiment, the dummy transistor (1) has similar dimension as the output transistor, (2) is located in close proximity to the output transistor, and (3) is turned OFF during sensing operation. The dummy transistor is used to achieve low voltage swing (small signal) sensing and provides for low power and high-speed operation.

In another aspect, a sense circuit is provided for sensing a logic state of a match line in a content addressable memory (CAM). The sense circuit includes a pair of amplifiers cross-coupled in a positive feedback configuration. The first amplifier has one input operatively coupled to the match line, and the second amplifier has one input operative to receive a reference signal. The match line is driven by a number of output transistors for a row of CAM cells. The reference signal is generated based on a row of dummy transistors that are similarly arranged as the output transistors. When enabled, the amplifiers detect the difference between the signals on the match line and the reference signal and further amplify the detected difference such that the logic value on the match line may be ascertained. The sense circuit may further include (1) a pair of pass transistors operatively coupled to the pair of amplifiers and used to enable the sense circuit, and (2) a switch coupled between outputs/inputs of the cross-coupled amplifiers and used to reset the amplifiers prior to each match line sense cycle. In a specific implementation, the first and second amplifiers may each be implemented as an inverter with gain (e.g., a P-channel transistor coupled in series with an N-channel transistor).

The match line is coupled to the output transistors for the row of CAM cells and may further be coupled directly to one input of the first amplifier. The dummy transistors couple to a dummy line that may further be coupled directly to one input of the second amplifier. Alternatively, the output transistors may also couple to a first common line that is coupled to the input of the first amplifier. In this case, the dummy transistors would similarly couple to a second common line that is coupled to the input of the second amplifier.

Various other aspects, embodiments, and features of the invention are also provided, as described in further detail below.

The foregoing, together with other aspects of this invention, will become more apparent when referring to the following specification, claims, and accompanying drawings.

BRIEF DESCRIPTION OF THE DRAWINGS

FIG. 1A is a block diagram of a conventional content addressable memory (CAM) unit;

FIGS. 2A, 2B, and 2C are respectively a block diagram, a schematic diagram, and a logic diagram for an embodiment of a conventional CAM cell;

DESCRIPTION OF THE SPECIFIC EMBODIMENTS

FIG. 1A is a block diagram of a conventional content addressable memory (CAM) unit 100a. CAM unit 100a includes a CAM array 110a coupled to sense circuits 150a. CAM array 110a is a two-dimensional array of M rows by N columns of CAM cells 120. Each row of the CAM array includes N cells that collectively store data for an entry in the array. Each row is further associated with a respective match line 130 that couples to all CAM cells in the row and further couples to sense circuits 150a.

Each of the N columns of the CAM array is associated with a specific bit position of an N-bit input address. A differential address line 132 is provided for each address bit and couples to all cells in the corresponding column of the CAM array. In this way, each bit of the N-bit input address may be compared with each of the M bits stored in the M cells in the corresponding column. The N-bit input address may thus be provided to all M rows of the CAM array and simultaneously compared against all entries in the array.

Typically, before performing the comparison between the input address and the entries in the CAM array, the M match lines for the M rows of the array are pre-charged to logic high (e.g., $V_{DD}$). For each row, if any cell in the row is not matched to the corresponding address bit, then the output transistor for that cell is turned ON and the match line is pulled to logic low (e.g., $V_{SS}$). Thus, for any given row, the match line remains at logic high (i.e., not pulled to $V_{SS}$) only if the output transistors for all N cells in the row are turned OFF, which only occurs if each bit for the input address matches the bit in the corresponding cell of the row. The match line for each row is thus at logic high for a match between the entry in that row and the input address, and is at logic low if there is no match (i.e., a mismatch) between the entry and the input address.

Figure 1B:
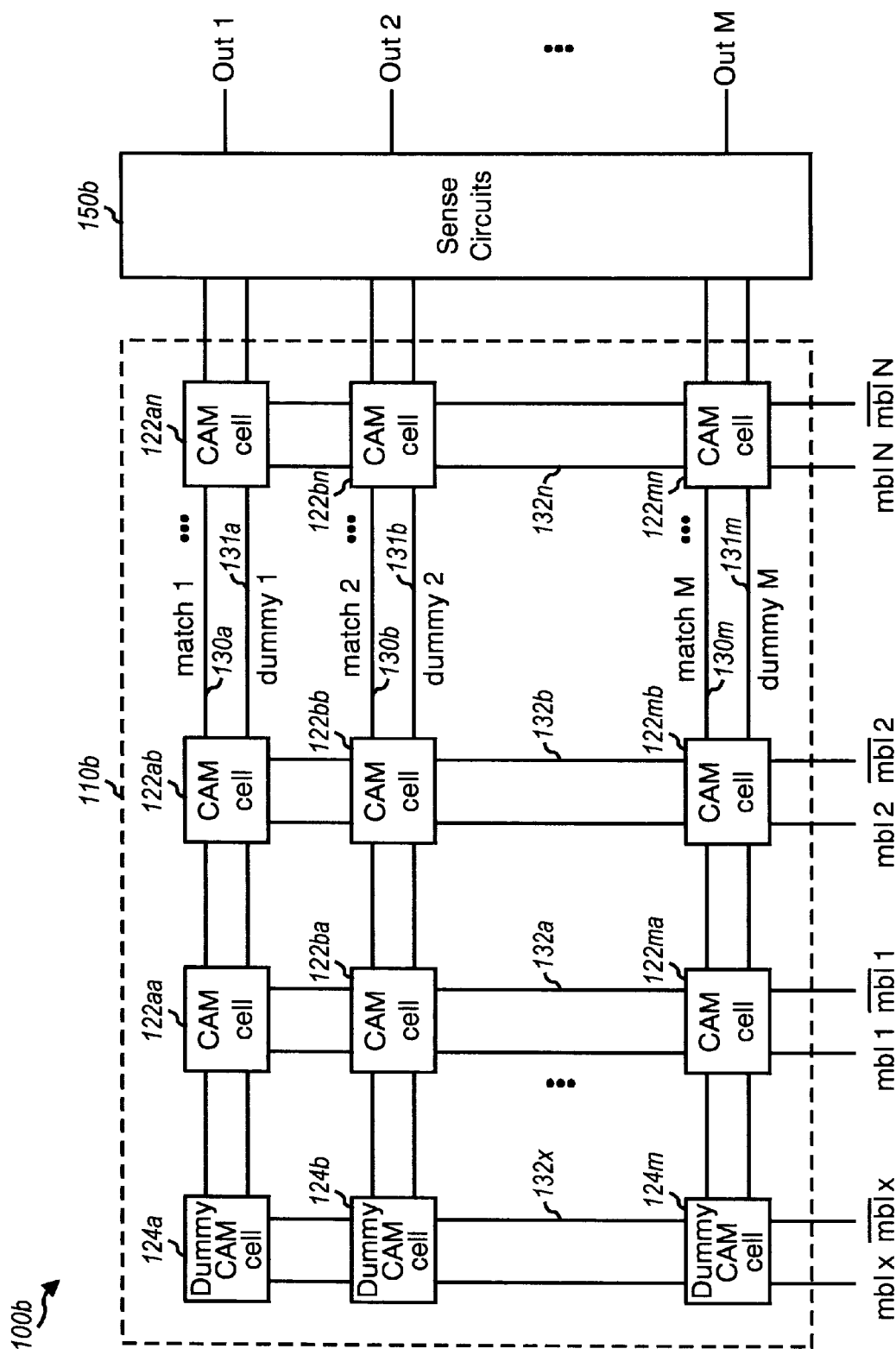
FIG. 1B is a block diagram of a CAM unit wherein certain aspects and embodiments of the invention may be implemented.

FIG. 1B is a block diagram of a CAM unit 100b having improved performance. CAM unit 100b includes a CAM array 110b coupled to sense circuits 150b. CAM array 110b is a two-dimensional array of M rows by N columns of CAM cells 122. Each row of the CAM array includes N cells that collectively store data for an entry in the array. Each row is further associated with a respective match line 130 and a dummy line 131 that couple to all CAM cells in the row and further couples to sense circuits 150.

CAM array 110b further includes a column of M dummy CAM cells 124, one dummy CAM cell for each row. Dummy CAM cells 124 allow for differential detection of the values stored in CAM cells 122, which are provided on match lines 130 and dummy lines 131, as described in further detail below.

FIG. 2A is a simple representation for a CAM cell 120x, which is one of many CAM cells 120 in FIG. 1A. CAM cell 120x receives a differential address line, mbl and $\overline{\text{mbl}}$, for a single bit of the input address and further couples to a single match line for one row of the CAM array.

FIG. 2B is schematic diagram of a specific design of CAM cell 120x, which may be used for each of the CAM cells 120 in FIG. 1A. CAM cell 120x includes a memory cell 210x coupled to a comparison circuit 230x. Memory cell 210x (which may also be referred to as a storage element or storage cell) is used to store a single bit value. Comparison circuit 230x is used to compare the stored bit value against an address bit.

As shown in FIGS. 2A and 2B, memory cell 210x comprises a pair of cross-coupled inverters 212a and 212b. Each inverter 212 is formed by a P-channel transistor 214 coupled to an N-channel transistor 216, as shown in FIG. 2B. The gates of transistors 214 and 216 couple together and form the input of the inverter, and the drains of these transistors similarly couple together and form the output of the inverter. The output of inverter 212a couples to the input of inverter 212b, the drain of an N-channel transistor 218a, and a complementary data line ($\overline{\text{d}}$) 220a. Similarly, the output of inverter 212b couples to the input of inverter 212a, the drain of an N-channel transistor 218b, and a data line (d) 220b. The gates of transistors 218a and 218b couple to a word line (wl), the source of transistor 218a couples to a complementary bit line ($\overline{\text{bl}}$) 224a, and the source of transistor 218b couples to a bit line (bl) 224b.

A data bit may be stored to memory cell 210x as follows. Initially, word line 222 is pulled to logic high to turn ON either transistor 218a or 218b. The logic value on the differential bit line ($\overline{bl}$ and bl) is then stored to the memory cell and maintained by inverters 212a and 212b. For example, if the complementary bit line ($\overline{bl}$) is at logic low and the bit line (bl) is at logic high, then transistor 218a is turned ON and transistor 218b is turned OFF. The complementary data line ($\overline{d}$) is then pulled to logic low, which then causes the output of inverter 212b to transition to logic high. This then turns ON transistor 216a and causes the output of inverter 212a to transition to logic low. After the bit value has been written to memory cell 210x, the word line is brought to logic low and the value is maintained by inverters 212a and 212b via a positive feedback mechanism. The process to store a bit of the opposite logic value proceeds in a complementary manner.

Comparison circuit 230x comprises a pair of N-channel transistors 232a and 232b and an N-channel output transistor 240. Transistors 232a and 232b have gates that couple to data lines 220a and 220b, respectively, sources that couple to an address line (mbl) 132xa and a complementary address line ($\overline{mbl}$) 132xb, respectively, and drains that couple together and to the gate of transistor 240. The source of transistor 240 couples to circuit ground (e.g., $V_{SS}$) and the drain of transistor 240 couples to a match line 130x for the row to which CAM cell 120x belongs.

Comparison circuit 230x operates as follows. If the address bit is not the same as the stored bit in memory cell 210x, then the value on address line (mdl) 132xa is the same as the value on complementary data line ($\overline{d}$) 220a, and the value on complementary address line ($\overline{mbl}$) 132xb is the same as the value on data line (d) 220b. In this case, node C will be at logic high (i.e., a high voltage level), and transistor 240 will be turned ON to indicate a mismatch. Alternatively, if the input address is the same as the stored bit in memory cell 210x, then node C will then be pulled to logic low by either transistor 232a or 232b, and output transistor 240 will be turned OFF to indicate a match. The ON state for output transistor 240 thus indicates a mismatch and the OFF state indicates a match.

FIG. 2C is a logical representation for memory cell 210x. Inverters 212a and 212b are cross-coupled so that the output of one inverter drives the input of the other inverter. Inverters 212a and 212b are thus coupled in a positive feedback circuit configuration. Transistors 218a and 218b act as switches that can be selectively turned ON to store a data value, which is then maintained by inverters 212a and 212b.

Figure 2D:
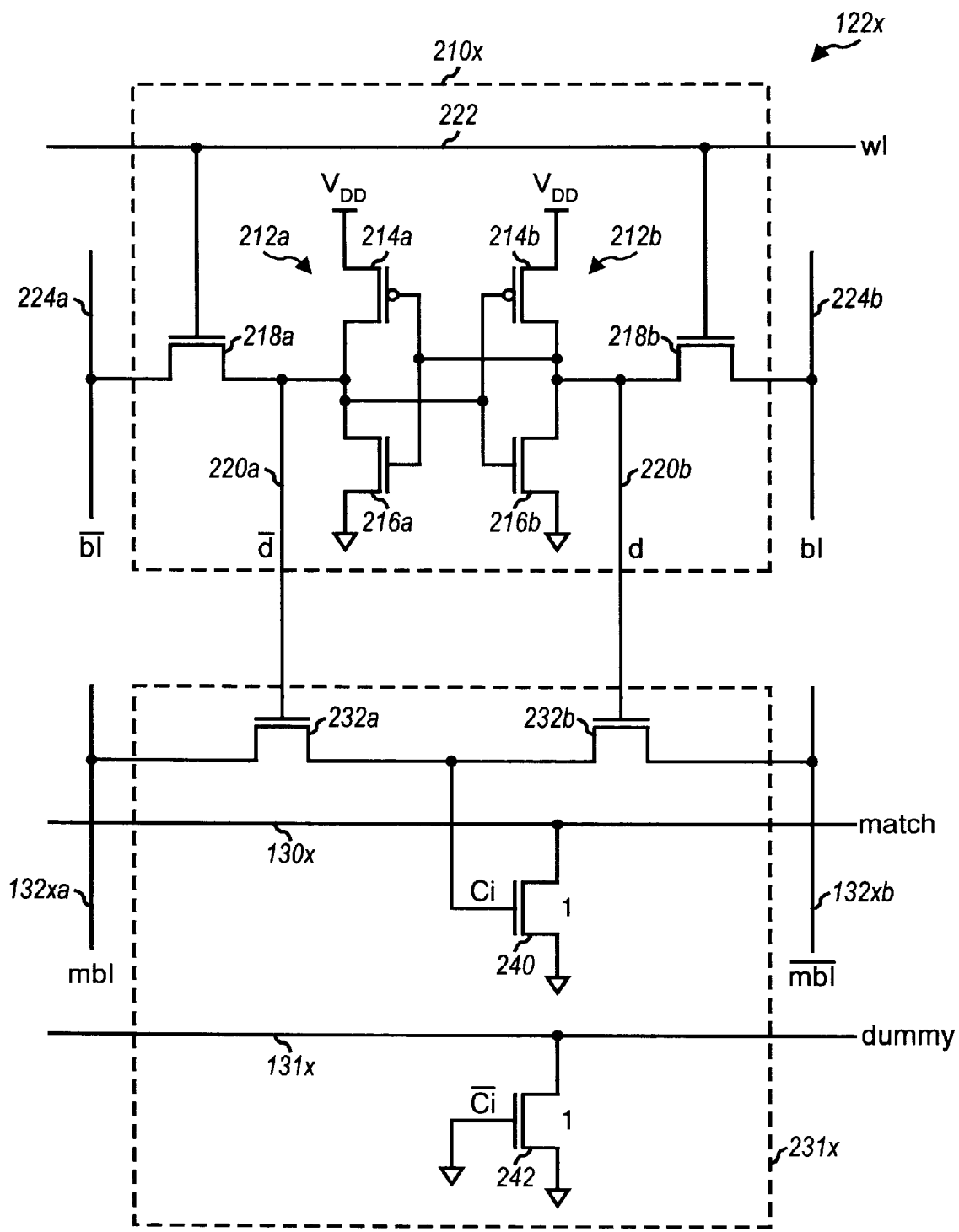
FIG. 2D is a schematic diagram of a binary CAM cell having improved performance.

FIG. 2D is schematic diagram of a specific design of a CAM cell 122x, which may be used for each of the CAM cells 122 in FIG. 1B. CAM cell 122x includes a memory cell 210x coupled to a comparison circuit 231x. Memory cell 210x is used to store a single data bit value, and is described above with reference to FIG. 2B.

Comparison circuit 231x comprises a pair of N-channel transistors 232a and 232b and an N-channel output transistor 240 used to drive match line 130x. These transistors are described above with reference to FIG. 2B. Comparison circuit 231x further comprises a dummy N-channel output transistor 242 used to provide the proper loading for dummy line 131x. The gate of dummy transistor 242 is coupled to logic low, and the dummy transistor is turned OFF. Dummy transistor 242 has a physical dimension that is the same as output transistor 240. In an embodiment, dummy transistor 242 is located near output transistor 240 and is oriented in the same direction.

Figure 2E:
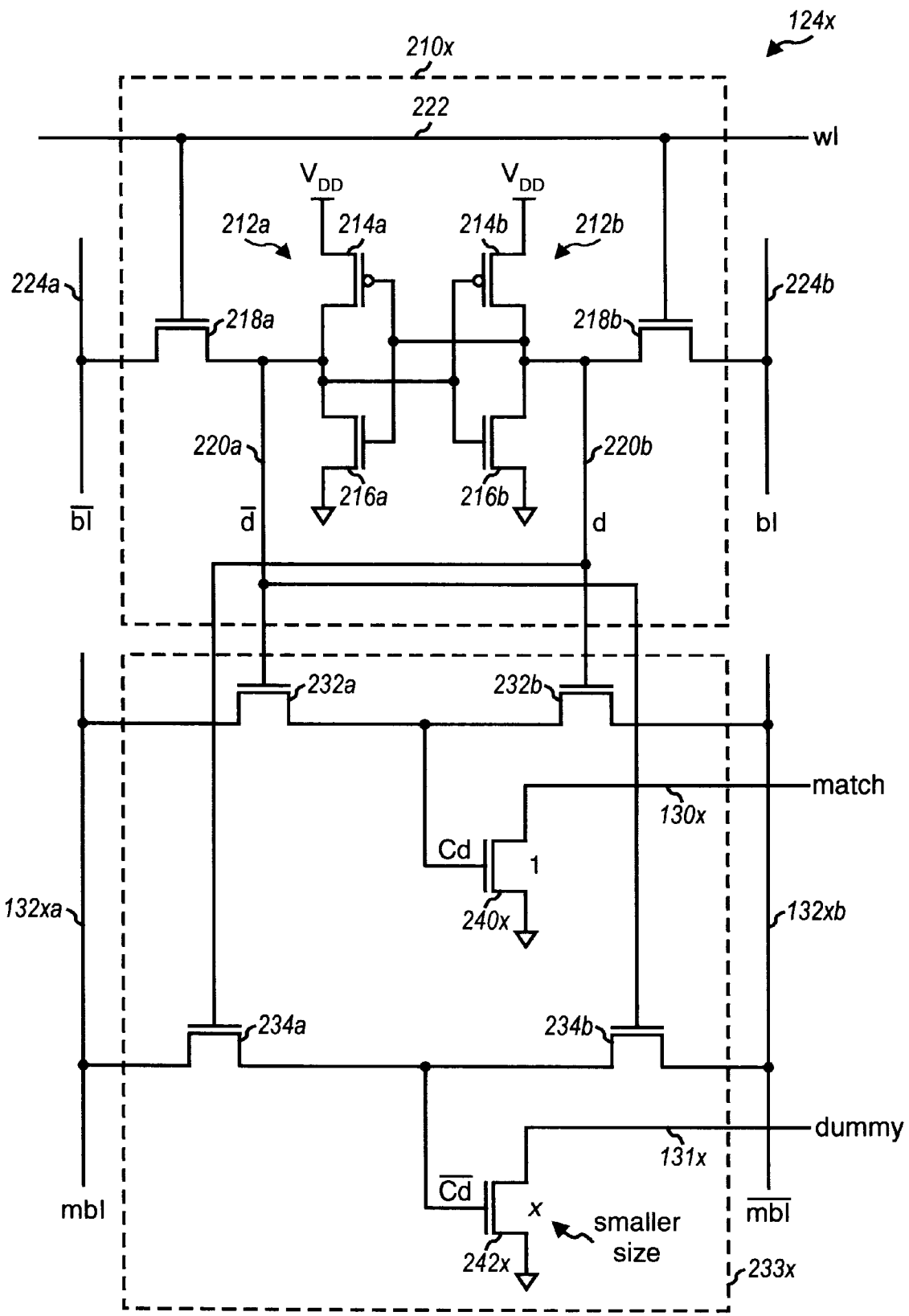
FIG. 2E is a schematic diagram of a dummy binary CAM cell.

FIG. 2E is schematic diagram of a specific design of a dummy CAM cell 124x, which may be used for each of the dummy CAM cells 124 in FIG. 1B. Dummy CAM cell 124x includes a memory cell 210x coupled to a comparison circuit 233x. Memory cell 210x is used to store a single data bit value, and is described above with reference to FIG. 2B. Comparison circuit 233x includes circuitry used to drive match line 130x and dummy line 131x. In particular, comparison circuit 233x comprises transistors 232a, 232b, and 240x coupled in the manner described above with reference to FIG. 2B and used to drive match line 130x. Comparison circuit 233x further comprises a pair of N-channel transistors 234a and 234b and an N-channel output transistor 242x used to drive dummy line 131x.

Transistors 234a, 234b, and 242x are coupled in similar manner as transistors 232a, 232b, and 240x for the match line, except that the gates of transistors 234a and 234b couple to the data line (d) and the complementary data line ($\overline{d}$), respectively. Thus, if transistor 242x is turned ON, then transistor 240x will be turned OFF. Otherwise, transistor 242x is turned OFF and transistor 240x will be turned ON. When transistor 240x is turned ON, the CAM row is disabled and the match line is asserted to mismatch status.

In an embodiment, transistors 242x has a physical dimension that is different from that of the other output transistors for the CAM cells within the same row. If the ratio of the width over the length of transistor 240x is normalized to be equal to 1

$$\left(\text{i.e.}, \frac{W_0}{\alpha L_0} = 1\right),$$

then the ratio of the width over the length of transistor 242x may be expressed as being equal to x, where $$x = \frac{W}{\alpha L}.$$

In an embodiment, x=0.5, which may be obtained by doubling the length of transistor 242x relative to that of transistor 240x $$\left(\text{i.e.}, x = \frac{W_0}{2\alpha L_0}\right)$$

or by reducing the width of transistor 242x relative to that of transistor 240x $$\left(\text{i.e.}, x = \frac{W_0/2}{\alpha L_0}\right).$$

The function performed by dummy CAM cell 124 is described in further detail below.

Figure 3A:
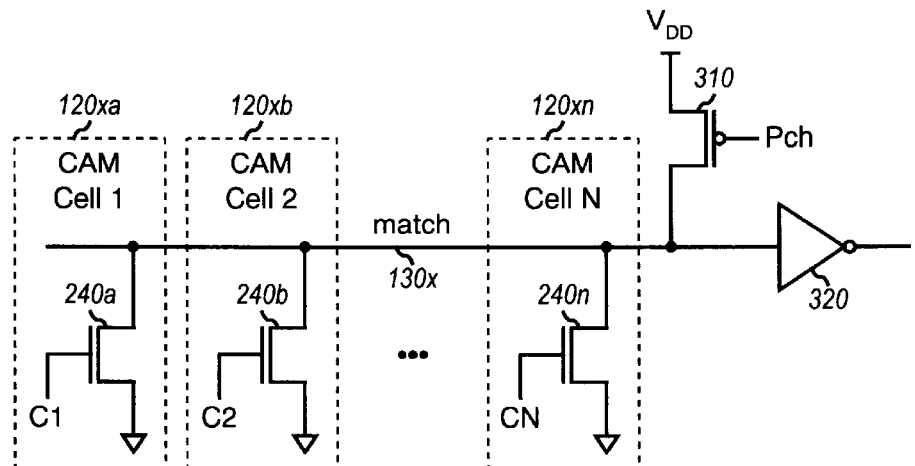
FIG. 3A is a schematic diagram of the driving circuits associated with a single match line.

FIG. 3A is a schematic diagram of the driving circuits associated with a single match line 130x. As shown in FIG. 1A, each match line 130 traverses the entire row of CAM array 110a and couples to output transistor 240 of each CAM cell 120 in the row. In FIG. 3A, transistors 240a through 240n thus represent the N output transistors for N CAM cells 120xa through 120xn in the row to which match line 130x is associated with. Each match line is further associated with a P-channel pre-charge transistor 310 and an output buffer 320.

The comparison of an entry for a row of CAM cells against the input address is performed as follows. Initially, the gate voltage of output transistors 240a through 240n are pre-set to logic low to turn OFF these transistors, and pre-charge transistor 310 is turned ON (by bringing the Pch control signal to logic low) to pre-charge match line 130x to a high level (e.g., $V_{DD}$). Pre-charge transistor 310 is then turned OFF, and the input address is written to address lines 132a through 132n (see FIG. 1A). The comparison circuit in each CAM cell in the row then operates to compare the stored bit in the CAM cell against the input address bit for that CAM cell. Depending on the stored value in each CAM cell and its input address bit, the output transistor for the CAM cell may be turned OFF for a match or turned ON for a mismatch, as described above.

If all N bits for the row are matched, then all N output transistors 240a through 240n are turned OFF, and match line 130x remains at the pre-charged level (e.g., of $V_{DD}$). Otherwise, if one or more bits are not matched, then each mismatched bit causes the corresponding output transistor to turn ON. If any of the N output transistors is turned ON, then those transistors would then discharge the match line (i.e., pull the match line to logic low or $V_{SS}$). Thus, the match line remains at logic high if the input address matches the stored content of the CAM cells in the row, and transitions to logic low if the input address does not match the stored content. Output buffer 320 buffers the match line and drives the subsequent circuitry.

As noted above, the match line configuration shown in FIG. 3A has several disadvantages related to speed and power. First, speed may be limited by the wired-OR design of the match line. Each row may include a large number of cells. If only one bit in the entire row mismatches, then only one output transistor will be turned ON and this transistor would need to pull the entire match line toward $V_{SS}$. In this case, a long time may be required to discharge the match line, which would then limit the speed at which the CAM array may be operated. Second, excessive power may be consumed by discharging all match lines that mismatch (which is typically all but one match line) toward $V_{SS}$. These disadvantages are ameliorated by the match line configurations described below.

Figure 3B:
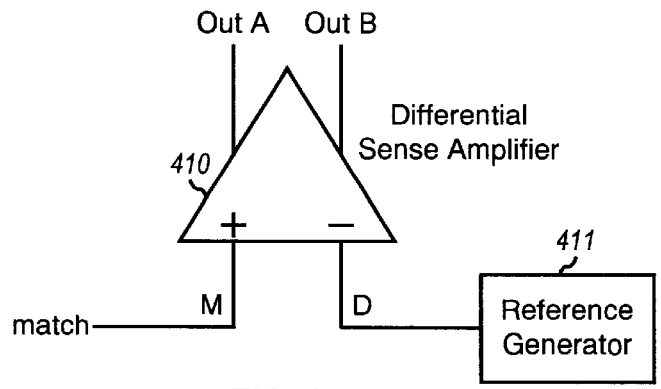
FIG. 3B is a block diagram of a sense circuit.

FIG. 3B is a block diagram of a differential sense circuit 410 that may be used to detect a signal (or voltage) on a match line. One sense circuit 410 may be coupled to each of the M match lines for the CAM array in FIG. 1A. Sense circuits 150 may thus include M sense circuits 410. Sense circuit 410 may be implemented with a current mirror type, a cross-coupled latch type, or some other design. A reference generator 411 provides a reference voltage for one input of sense circuit 410, and the match line couples to the other input of the sense circuit. Reference generator 411 may be implemented with dummy transistors (as described below), a voltage divider that can provide a constant voltage, or some other design.

Figure 3C:
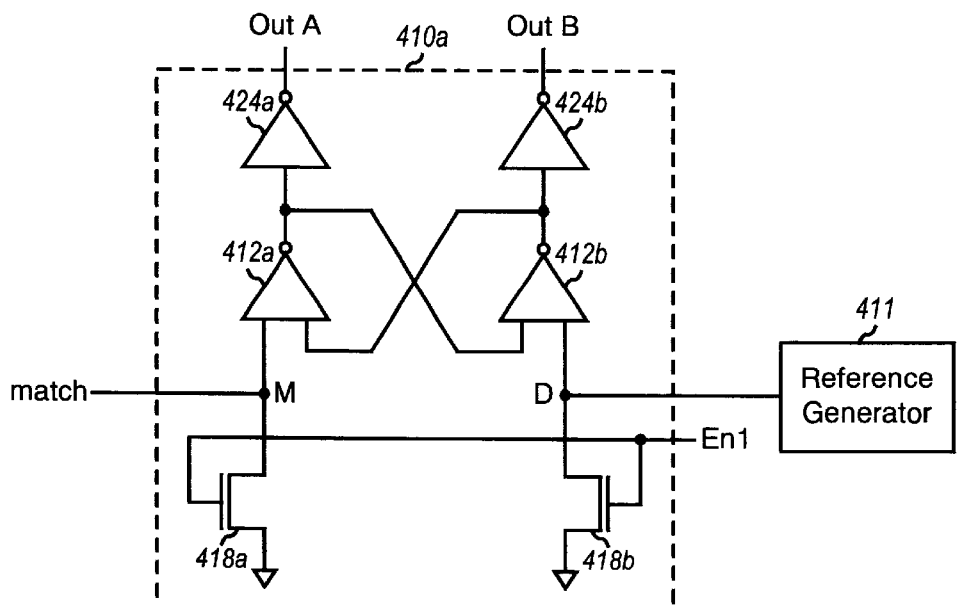
FIG. 3C is a schematic diagram of an embodiment of a sense circuit that may be used to detect the signal on a match line.

FIG. 3C is a schematic diagram of an embodiment of a sense circuit 410a that may be used to detect a signal (or voltage) on a match line. In the embodiment shown in FIG. 3C, sense circuit 410a includes a pair of inverting amplifiers 412a and 412b cross-coupled so that the output of one amplifier drives the input of the other amplifier. Amplifiers 412a and 412b are thus coupled in a positive feedback circuit configuration. Transistor 418a couples to one input of amplifier 412a and to the match line at node M, and transistor 418b couples to one input of amplifier 412b and to an output from reference generator 411 at node D. Nodes M and D effectively provide a differential drive for the pair of cross-coupled amplifiers 412a and 412b. Inverting buffers 424a and 424b provide buffering for the detected data bit from inverters 412a and 412b, respectively, and further derive the Out A and Out B outputs. The operation of sense circuit 410a is described below.

Figure 4A:
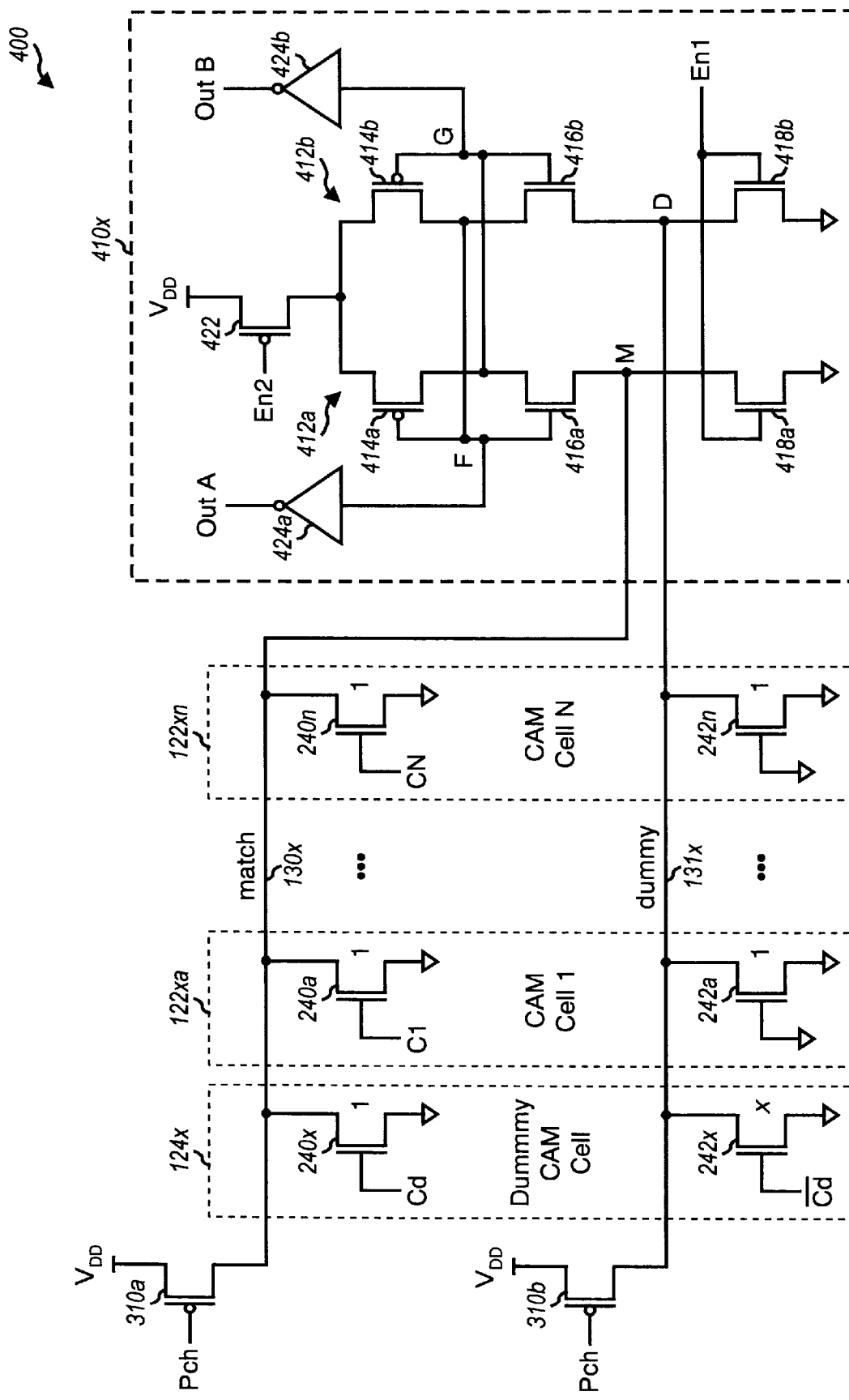
FIGS. 4A and 4B are schematic diagrams of an embodiment of two match line detection mechanisms.

FIG. 4A is a schematic diagram of a match line detection mechanism 400, which may be used in conjunction with the inventive CAM cells 122 and dummy CAM cells 124 in CAM unit 100b in FIG. 1B, in accordance with an embodiment of the invention. Similar to FIG. 3A, match line 130x couples to N output transistors 240a through 240n for N CAM cells 122xa through 122xn and to output transistor 240x for dummy CAM cell 124x in a specific row of the CAM array. Match line 130x further couples to a P-channel transistor 310a, which is used to pre-charge the match line (e.g., to $V_{DD}$) at the start of each detection cycle. Match line 130x further couples to a first input (node M) of a sense circuit 410x, which is used to sense the signal or voltage on the match line. Sense circuit 410x is a specific embodiment of sense circuit 410 in FIG. 3B.

Dummy line 131x couples to N dummy transistors 242a through 242n for N CAM cells 122xa through 122xn and to dummy transistor 242x for dummy CAM cell 124x in the same row of the CAM array as the associated match line 130x. Dummy transistors 242x and 242a through 242n are used to generate a reference signal for sense circuit 410x, and may thus be viewed as one implementation of reference generator 411 in FIG. 3B. Dummy transistors 242a through 242n mimic the loading observed on match line 130x. Dummy line 131x also couples to a P-channel transistor 310b, which is used to pre-charge the dummy line at the start of each detection cycle. Dummy line 131x further couples to a second input (node D) of sense circuit 410x.

As shown in FIG. 4A, dummy transistors 242a through 242n for CAM cells 122xa through 122xn are each dimensioned with a normalized size of 1 (i.e., W/L→1, where W is the width and L is the channel length of the transistor). Output transistors 240a through 240n for the CAM cells and output transistor 240x for dummy CAM cell 124x are each also dimensioned with the normalized size of 1. However, dummy transistor 242x for dummy CAM cell 124x is dimensioned with a normalized size of less than 1 (i.e., x<1) and thus has reduced drive capability in comparison to each output transistor 240. In one specific embodiment, x≈0.5. As also shown in FIG. 4A, all dummy transistors 242a through 242n in the CAM cells are turned OFF by grounding the gates of these N-channel dummy transistors. However, dummy transistor 242x for dummy CAM cell 124x may be turned ON and has a size that is only a fraction (e.g., half) of the size of the other output and dummy transistors.

In the match situation, all of the transistors coupled to the match line (i.e., transistors 240a through 204n and 240x) will be turned OFF, and the match line will not be discharged. However, the dummy line will be discharged through dummy transistor 242x (which has a size that is a fraction x) and the dummy line voltage will be lower than the match line voltage. Conversely, in the mismatch situation, even if only one bit is mismatched, the match line will be discharged through the one or more transistors 240 for the mismatched CAM cells (which have a size of 1) at a speed faster than dummy line. In this case, the match line voltage will be lower than that of the dummy line voltage.

In the specific embodiment of sense circuit 410x shown in FIG. 4A, N-channel transistors 418a and 418b have gates that couple together and to an En1 control signal and sources that couple to ground (e.g., $V_{SS}$). In an embodiment, amplifiers 412a and 412b are designed as inverters with gains, and are thus referred to as simply inverters. Inverters 412a and 412b couple to transistors 418a and 418b, respectively, and further to inverters 424a and 424b, respectively. Each inverter 412 comprises a P-channel transistor 414 coupled to an N-channel transistor 416. The gates of transistors 414a and 416a couple together and form one input of inverter 412a (node F). The source of transistor 414a couples to the drain of transistor 416a and form the output of inverter 412a, which couples to the gates of transistors 414b and 416b and to the input of inverting buffer 424b. Similarly, the gates of transistors 414b and 416b couple together and form one input of inverter 412b (node G). The source of transistor 414b couples to the drain of transistor 416b and form the output of inverter 412b, which couples to the gates of transistors 414a and 416a and to the input of inverting buffer 424a. The sources of N-channel transistors 416a and 416b couple to the drains of transistors 418a and 418b, respectively. The drains of transistors 414a and 414b couple together.

A P-channel transistor 422 has a gate that couples to an En2 control signal, a source that couples to the drains of transistors 414a and 414b, and a drain that couples to the upper voltage supply (e.g., $V_{DD}$). The inputs of inverting buffers 424a and 424b couple to the outputs of inverters 412b and 412a, respectively, and the outputs of buffers 424a and 424b drives the Out A and Out B outputs, respectively.

The voltage on node M represents the signal on the match line 130x to be detected. The voltage on node D represents the reference signal to which the voltage on node M is compared against. Inverters 412a and 412b amplify the voltage difference between nodes M and D.

The reference signal at node D is generated by dummy transistors 242x and 242a through 242n. The reference signal may be determined, in part, by selecting the proper sizes for dummy transistors 242x and pre-charge transistor 310b, which is usually equal to transistor 310a.

Figure 5A:
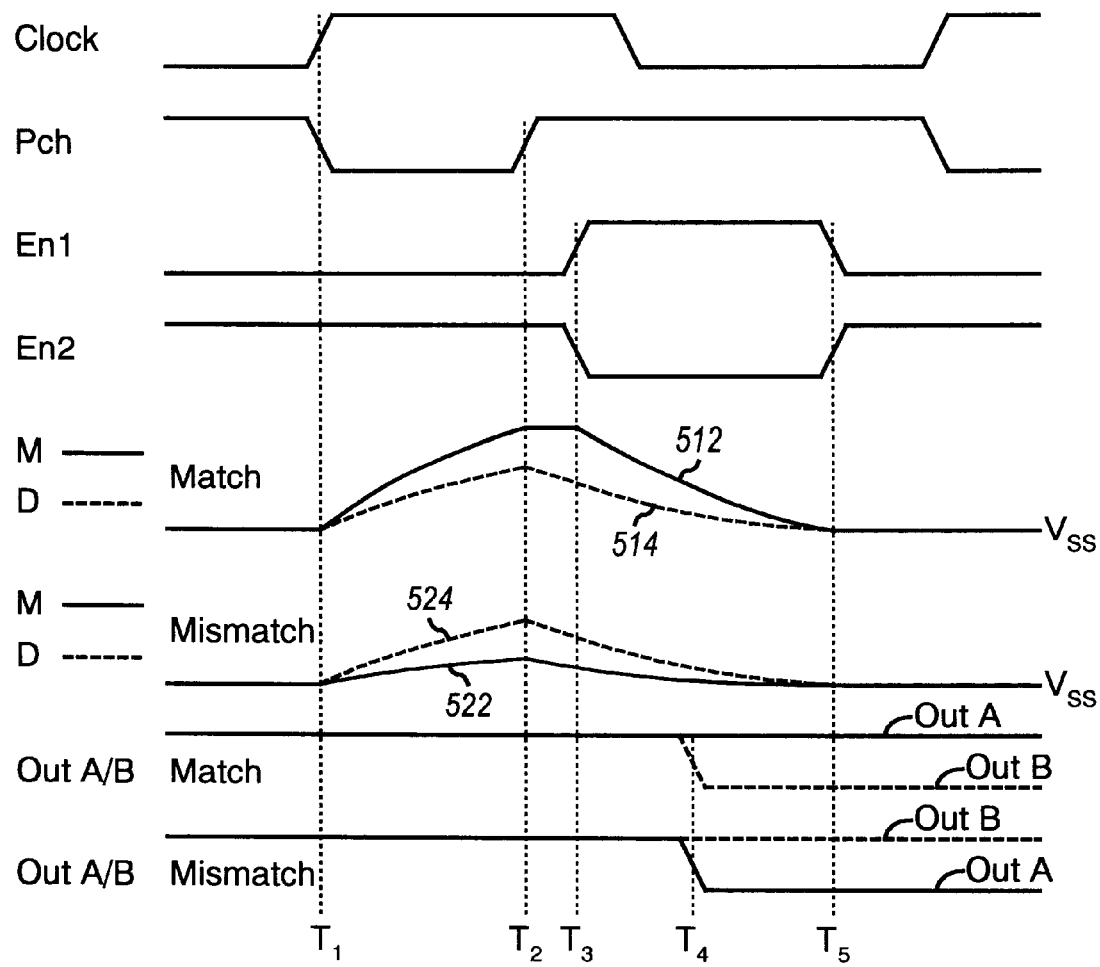
FIGS. 5A and 5B are timing diagrams for the match line detection mechanisms shown in FIGS. 4A and 4B, respectively.

FIG. 5A is a timing diagram for match line detection mechanism 400 in FIG. 4A. This timing diagram shows various control signals for sense circuit 410x to detect the signal (or voltage) on match line 130x, the voltages at nodes M and D, and the sense circuit outputs. The control signals are generated based on a clock signal, which is shown at the top of FIG. 5A for reference. The operation of the sense circuit is now described in reference to both FIGS. 4A and 5A.

Initially, prior to time $T_1$, the Pch and En2 control signals are at logic high, the En1 control signal is at logic low, and the voltages at nodes M and D are pre-set to $V_{SS}$. At time $T_1$, which may correspond to the rising (or leading) edge of the clock signal, the Pch control signal is brought to logic low, which then turns ON transistors 310a and 310b. At approximately the same time $T_1$, the address to be compared are written in through the address line (mbl) and its complementary address line ($\overline{mbl}$), the comparison circuits for the CAM cells coupled to the match line are enabled. Each of the N output transistors 240 for these comparison circuits may thereafter be turned ON or OFF depending on its comparison result. In a typical design, the comparison circuits could be enabled either before or after time $T_1$ when the pre-charge is finished.

Upon being turned ON at time $T_1$, transistor 310a starts pre-charging match line 130x toward $V_{DD}$, and transistor 310b similarly starts pre-charging dummy line 131x toward $V_{DD}$. If there is a match between the input address and the contents of the CAM cells in the row corresponding to the match line, then all N output transistors 240a through 240n will be turned OFF, and transistor 310a is able to pre-charge the match line to a higher voltage and faster, as shown by plot 512 in FIG. 5A. In comparison, since transistor 242x coupled to dummy line 131x is turned ON, transistor 310b is able to pre-charge the dummy line at a slower rate, as shown by plot 514 in FIG. 5A. Thus, if there is a match, then the voltage on match line 130x is higher than the voltage on dummy line 131x.

Conversely, if there is a mismatch between the input address and the CAM cell contents, then at least one output transistor 240 coupled to match line 130x will be turned ON, and the voltage on the match line will be pre-charge more slowly, as shown by plot 522 in FIG. 5A. Although transistor 242x coupled to dummy line 131x is also turned ON, it is only a fraction of the size of the output transistors 240 coupled to the match line and discharges at a fraction of the rate of transistor 240. As a result, transistor 310b is able to pre-charge the dummy line at a faster rate than for the match line, as shown by plot 524 in FIG. 5A. Thus, if there is a mismatch, then the voltage on dummy line 131x is higher than the voltage on match line 130x.

At time $T_2$, the Pch control signal is brought to logic high, which then turns OFF transistors 310a and 310b. The pre-charge is stopped at this point. If there is a match, then all N output transistors 240a through 240n are turned OFF, and the voltage on the match line is maintained at the same level, as shown by plot 512 in FIG. 5A. In contrast, the voltage on the dummy line is continuously discharged (i.e., pulled toward $V_{SS}$) by the one dummy transistor 242x that is turned ON, and the voltage at node D is pulled lower as shown by plot 514 in FIG. 5A.

Conversely, if there is a mismatch, then at least one output transistor 240 coupled to the match line will be turned ON, and the voltage on the match line is discharged by the output transistor(s) that are turned ON, as shown by plot 522 in FIG. 5A. Since the output transistor coupled to the match line is larger than the ON dummy transistor 242x coupled to the dummy line, the match line is pulled toward $V_{SS}$ at a faster rate. Moreover, since the voltage on the match line is lower than that on the dummy line for a mismatch, the voltage on the match line will continue to be even much lower than that on the dummy line as both the match and dummy lines are pulled toward $V_{SS}$ starting at time $T_2$.

At time $T_3$, the En1 control signal is brought to logic high and the En2 control signal is brought to logic low. The logic high on the En1 control signal turns ON transistors 418a and 418b, and the logic low on the En2 control signal turns ON transistor 422. These control signals enable sense circuit 410x by turning ON transistors 418a, 418b, and 422.

With sense circuit 410x enabled, the voltages at nodes M and D are detected and the voltage difference is amplified by the pair of inverters 412a and 412b cross-coupled to provide positive feedback. Inverters 412a and 412b then drive their outputs to opposite rails, with the polarity being dependent on the sign of the detected voltage difference.

In particular, if there was a match, then the voltage on node M is higher than the voltage on node D, as shown by plots 512 and 514 in FIG. 5A. This then turns ON transistor 416b more (i.e., sinks more current), which then pulls node F lower. The lower voltage on node F turns ON transistor 414a more and turns OFF transistor 416a more, which then pulls node G higher. The higher voltage on node G turns OFF transistor 414b more and turns ON transistor 416b more. In this way, the voltage at node F is pulled low toward $V_{SS}$, and the voltage at node G is pulled high toward $V_{DD}$ (i.e., the voltages at these two nodes are pulled apart and toward their respective rail voltages).

Conversely, if there was a mismatch, then the voltage on node D is higher than the voltage on node M, as shown by plots 522 and 524 in FIG. 5A. This then turns ON transistor 416a more, which then pulls node G lower. Transistor 414b is then turned ON more, which then pulls node F higher. The voltage at node F is thus pulled toward $V_{DD}$, and the voltage at node G is pulled toward $V_{SS}$. In a typical implementation, before the sensing the voltages of nodes D and M starts, nodes F and G are equalized as shown in FIG. 5A.

Thus, shortly after sense circuit 410x is enabled by the En1 and En2 control signals, inverters 412a and 412b sense the voltage on node M relative to the voltage on node D, and the sensed difference is provided via buffers 424a and 424b to the Out A and Out B outputs. At time $T_4$, Out A is at logic high if there was a match and at logic low if there was a mismatch, and Out B is at logic low if there was a match and at logic high if there was a mismatch, as shown by the plots for these outputs in FIG. 5A.

After time $T_3$, transistors 418a and 418b are turned ON and respectively pull the voltages at nodes M and D slowly toward $V_{SS}$ because of the big capacitance from a large number of transistors coupled to these nodes.

If there was a match, then transistors 414a and 416b are both turned ON, and transistors 414b and 416a are both turned OFF. Transistor 414a pulls node G high toward $V_{DD}$. Since transistor 416a is turned OFF, no current conducts through inverter 412a after node G has been pulled high. Conversely, transistor 416b pulls node F low toward $V_{SS}$. Since transistor 414b is turned OFF, no current conducts through inverter 412b after node F has been pulled low. Thus, once node F has been pulled low and node G has been pulled high, transistors 418a and 418b are able to discharge nodes M and D, respectively, and pull these nodes to $V_{SS}$, as shown in FIG. 5A. Nodes M and D are now ready for the next sense operation in the next clock cycle. The complementary actions occur if there was a mismatch, but the voltages at nodes M and D are also pulled to $V_{SS}$.

Match line detection mechanism 400 has several advantages over the conventional detection mechanism. Detection mechanism 400 may be operated at higher speed and lower power than conventional designs. First, as shown in FIG. 5A, the voltage on the match line is compared against the voltage on the dummy line. The voltages on both the match line and dummy line may be charged to only a fraction of $V_{DD}$ (instead of $V_{DD}$) for reliable detection of the signal on the match line. This may be achieved by (1) properly designing sense circuit 410x, (2) selecting the proper sizes for transistors 240, 242, and 242x, pre-charge transistors 310a and 310b, and (3) providing the proper control signals that determine the times $T_2$, $T_3$, and $T_4$. Second, sense circuit 410x is able to detect and amplify a small voltage difference between nodes M and D. And third, power consumption is reduced by limiting the signal swing to a fraction of $V_{DD}$ instead of the full $V_{DD}$, as shown in FIG. 5A. Power consumption is proportional to the square of the voltage swing, and a smaller signal swing results in lower power consumption.

Figure 4B:
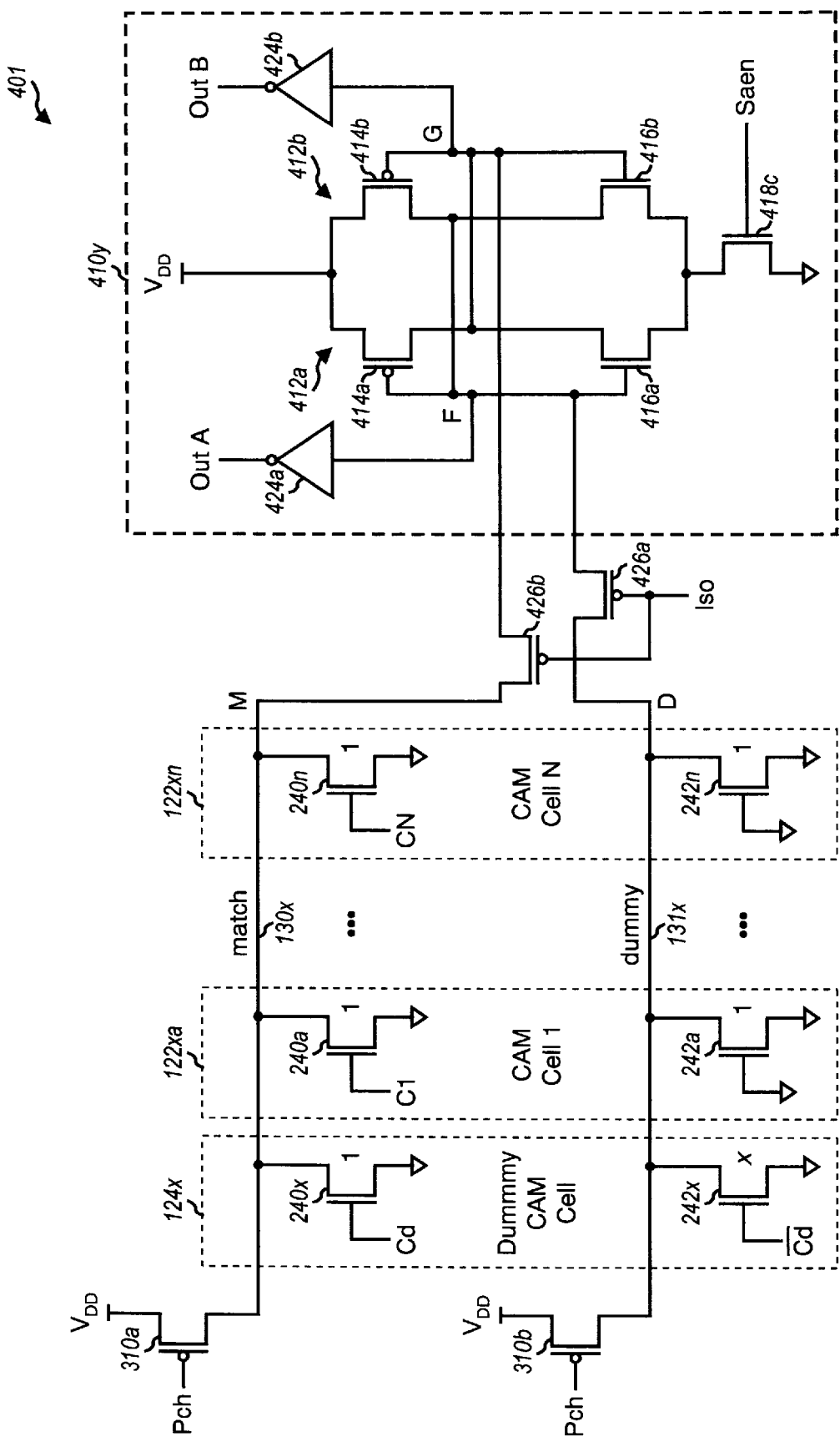

FIG. 4B is a schematic diagram of a match line detection mechanism 401, which may also be used in conjunction with the inventive CAM cells 122 and dummy CAM cells 124 in CAM unit 100b in FIG. 1B, in accordance with an embodiment of the invention. Similar to FIG. 4A, match line 130x couples to N output transistors 240a through 240n for N CAM cells 122xa through 122xn, output transistor 240x for dummy CAM cell 124x, and pre-charge transistor 310a. Match line 130x further couples to a first P-channel pass transistor 426b, which couples the match line to sense circuit 410y. Sense circuit 410y is a specific embodiment of sense circuit 410 in FIG. 3B.

Dummy line 131x couples to N dummy transistors 242a through 242n for N CAM cells 122xa through 122xn, dummy transistor 242x for dummy CAM cell 124x, and pre-charge transistor 310b. Dummy line 131x further couples to a second P-channel pass transistor 426a, which couples the dummy line to sense circuit 410y.

In the specific embodiment of sense circuit 410y shown in FIG. 4B, an N-channel transistor 418c has a gate that couples to a Saen control signal, a source that couples to ground, and a drain that couples to the sources of transistors 416a and 416b. Transistors 416a and 416b and 418a and 418b are coupled as shown in FIG. 4A. However, the drains of transistors 418a and 418b couple directly to the upper voltage supply (e.g., $V_{DD}$).

Pass transistors 426a and 426b are used to respectively isolate the capacitance on the dummy and match lines from nodes D and M within sense circuit 410y. The capacitance on each of these lines is relatively high because a number of output or dummy transistors are coupled to the line. The isolation provided by pass transistors 426a and 426b allows sense circuit 410y to operate at a higher speed for sensing operation, since the internal nodes may be charged and discharged at a faster rate with reduced capacitance loading on the internal nodes.

Figure 5B:
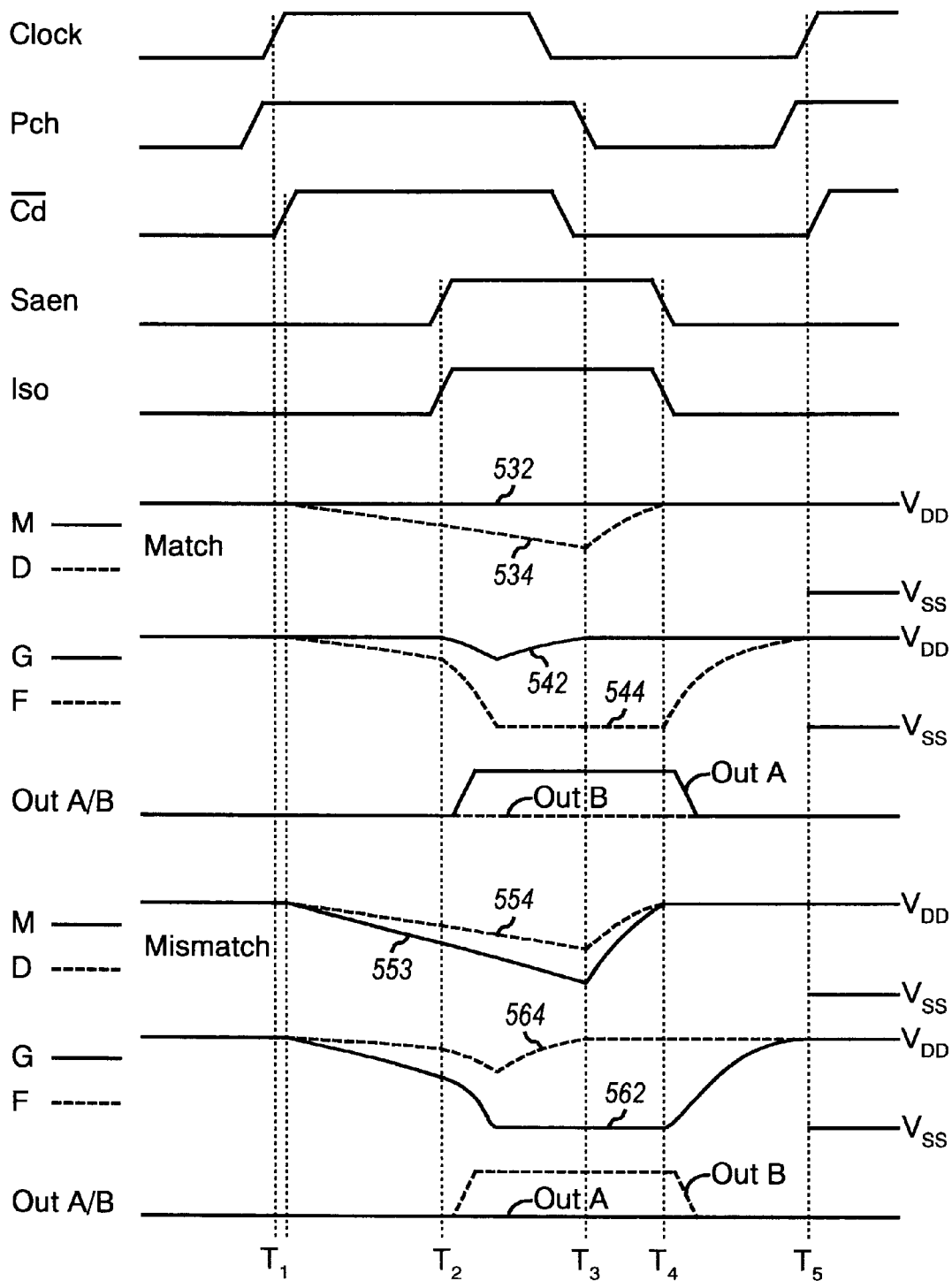

FIG. 5B is a timing diagram for match line detection mechanism 401 in FIG. 4B. This timing diagram shows various control signals for sense circuit 410y to detect the signal on match line 130x, the voltages at nodes M and D and nodes F and G, and the sense circuit outputs. The control signals are generated based on a clock signal, which is shown at the top of FIG. 5B for reference.

Initially, prior to time $T_1$, the Pch control signal is at logic low, and the voltages at nodes M and D are pre-charged to $V_{DD}$. Nodes G and F are also pre-charged to $V_{DD}$ via pass transistors 426a and 426b, which are turned ON at this time. Near time $T_1$, the Pch control signal is brought to logic high, which then turns OFF transistors 310a and 310b. At approximately the same time $T_1$, the address to be compared is written to the address line, and the comparison circuits for the CAM cells are enabled. Each of the N output transistors 240 for these comparison circuits may thereafter be turned ON or OFF depending on its comparison result.

If there is a match between the input address and the contents of the CAM cells, then all N output transistors 240a through 240n will be turned OFF, and the match line remains at its pre-charged level, as shown by plot 532 in FIG. 5B. In comparison, since transistor 242x coupled to dummy line 131x is turned ON, this transistor pulls the dummy line to a lower voltage, as shown by plot 534 in FIG. 5B. Thus, if there is a match, then the voltage on match line 130x is higher than the voltage on dummy line 131x. The Iso control signal is at logic low during this time, pass transistors 426a and 426b are turned ON, and the dummy and match lines are respectively coupled to nodes G and F of sense circuit 410y.

At time $T_2$, the Saen control signal is brought to logic high, which then turns ON transistor 418c and enables sense circuit 410y. The Iso control signal is also brought to logic high, which then turns OFF pass transistors 426a and 426b. The differential voltage between nodes G and F are then amplified by sense circuit 410y and Outputs A and B are provided as shown in FIG. 5B.

At time $T_3$, the Pch control signal is brought to logic low, the pre-charge transistors 310a and 310b are turned ON, and the dummy and match lines are pulled toward $V_{DD}$. At time $T_4$, the Saen and Iso control signals are brought to logic low, the dummy and match lines are coupled to nodes G and F, and these nodes are pulled toward $V_{DD}$ by pre-charge transistors 310a and 310b to get ready for the next sensing cycle.

The signal swing for the mismatch situation is also shown in FIG. 5B.

Figure 6:
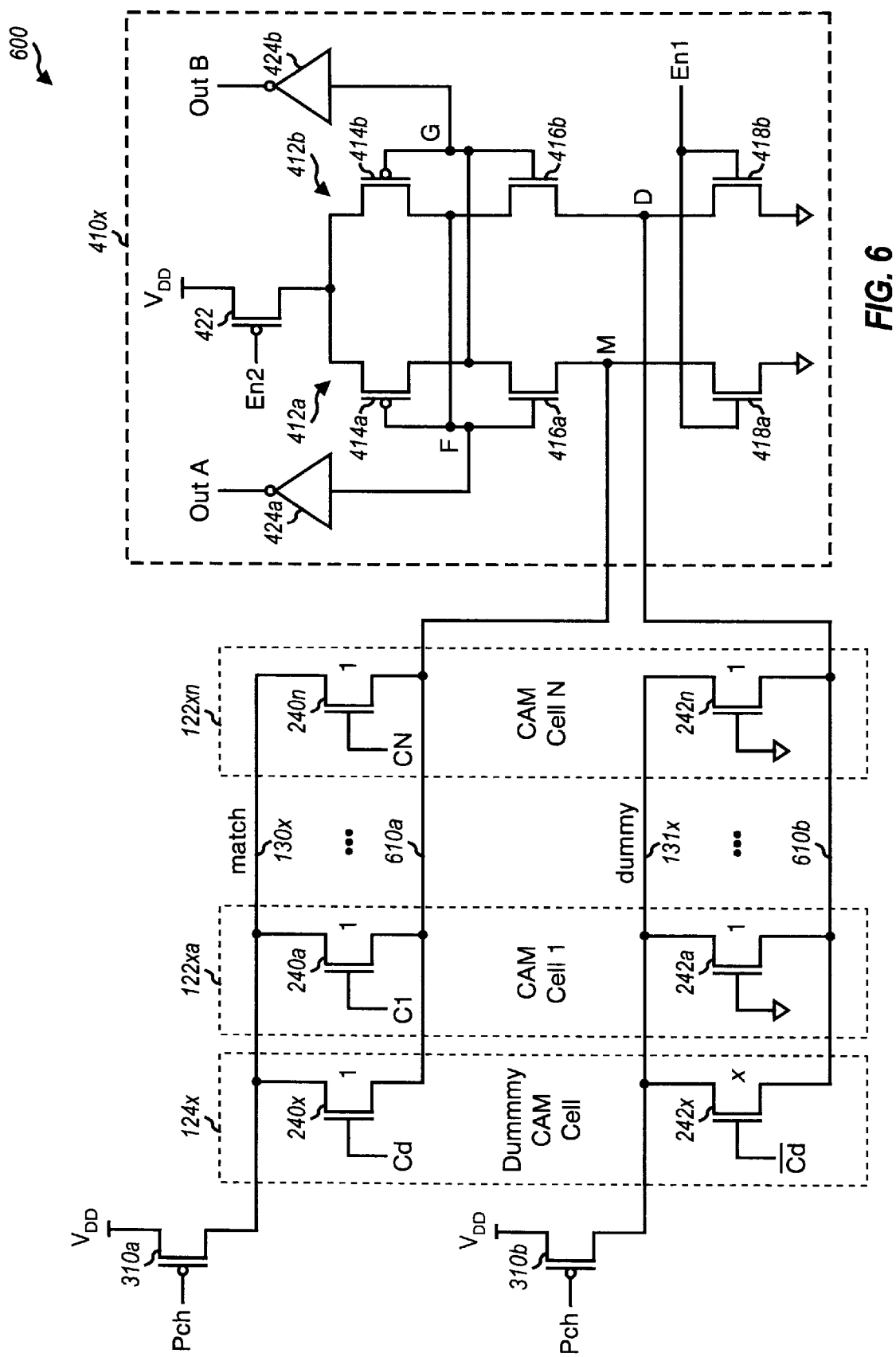
FIG. 6 is a schematic diagram of another embodiment of a match line detection mechanism.

FIG. 6 is a schematic diagram of a match line detection mechanism 600, which may be used in conjunction with CAM cells 122 and 124 in CAM unit 100b in FIG. 1B, in accordance with another embodiment of the invention. Similar to FIG. 4A, match line 130x couples to N output transistors 240a through 240n for the N CAM cells in a specific row of the CAM array and further couples to P-channel transistor 310a. However, the sources of output transistors 240a through 240n are coupled to node M of sense circuit 410x via a first common line 610a, which may be implemented with a metal track in the circuit layout. A row of N dummy transistors 242a through 242n and 242x couples to dummy line 131x, which further couples to P-channel transistor 310b. The sources of dummy transistors 242a through 242n and 242x are coupled to node D of sense circuit 410x via a second common line 610b.

Figure 7:
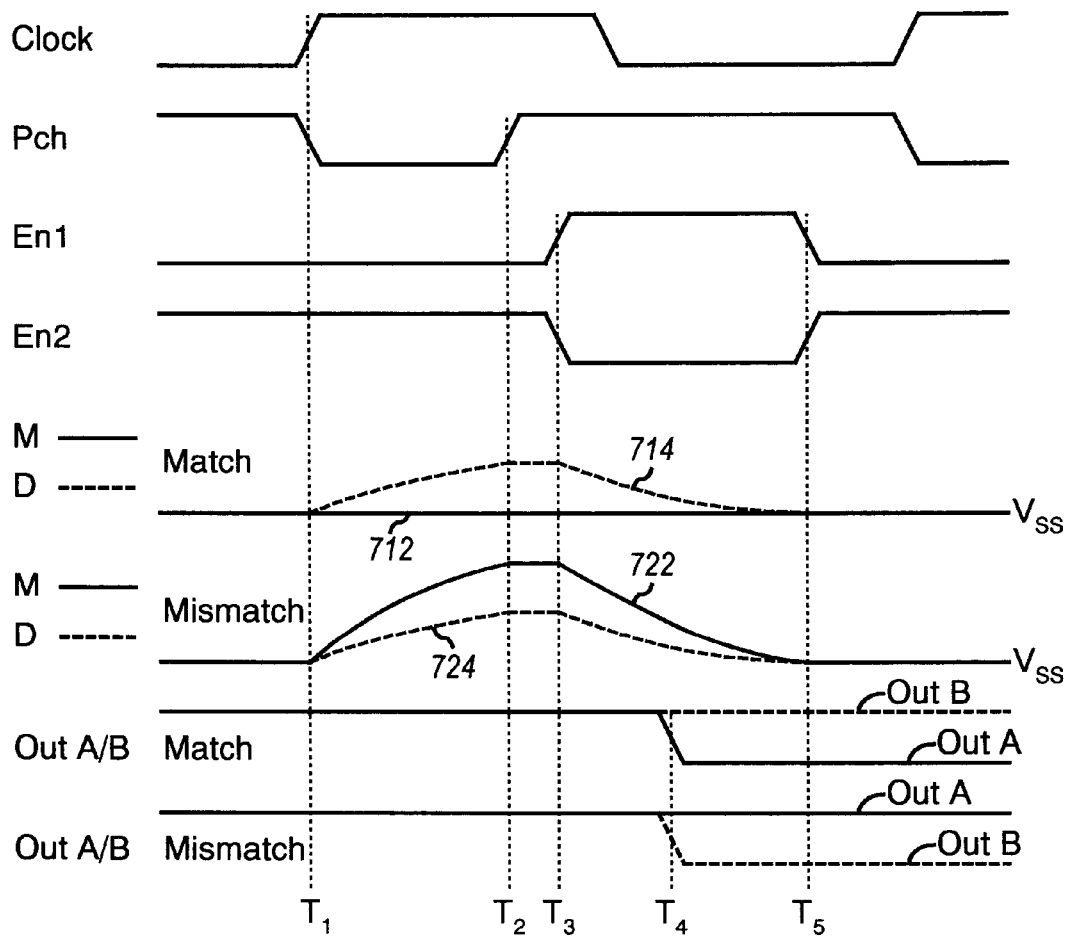
FIG. 7 is a timing diagram for the match line detection mechanism shown in FIG. 6.

FIG. 7 is a timing diagram for match line detection mechanism 600 in FIG. 6. Similar to FIG. 5, FIG. 7 shows the control signals, the voltages at nodes M and D, and the sense amplifier outputs for the match line detection. The operation of detection mechanism 600 is now described in reference to both FIGS. 6 and 7.

The operation of sense circuit 410x in FIG. 6 is similar to that described above for detection mechanism 400 in FIG. 4A. Initially, prior to time $T_1$, the Pch and En2 control signals are at logic high, the En1 control signal is at logic low, and the voltages at nodes M and D are pre-set to $V_{SS}$. At time $T_1$, the Pch control signal is brought to logic low, which then turns ON transistors 310a and 310b. Near time $T_1$, each of the N output transistors 240 for the CAM cells coupled to the match line is turned ON or OFF based on its comparison result.

If there is a match, then all N output transistors 240 are turned OFF, and the voltage on common line 610a is maintained at $V_{SS}$, as shown by plot 712 in FIG. 7, even though match line 130x is pulled toward $V_{DD}$. In contrast, the voltage on common line 610b is pulled toward $V_{DD}$ by the one dummy transistor 242x that is turned ON, as shown by plot 714 in FIG. 7. Thus, the voltage on common line 610b for the dummy transistors is higher than the voltage on common line 610a for the output transistors for a match.

Conversely, if there is a mismatch, then at least one output transistor 240 is turned ON, and common line 610a is pulled toward $V_{DD}$ by the ON transistor(s), as shown by plot 722 in FIG. 7. Since the output transistors 240 coupled to the match line are larger than the ON dummy transistor 242x coupled to the dummy line, the match line is pulled toward $V_{DD}$ at a faster rate. Thus, the voltage on common line 610a for the output transistors is higher than the voltage on common line 610b for the dummy transistors for a mismatch.

At time $T_2$, the Pch control signal is brought to logic high, transistors 310a and 310b are both turned OFF, and the voltages on the match line, dummy line, and common lines 610a and 610b are maintained for both the match and mismatch cases. If there was a match, then the voltage on node D is higher than the voltage on node M when transistors 310a and 310b are turned OFF, as shown by plots 712 and 714 in FIG. 7. Conversely, if there was a mismatch, then the voltage on node M is higher than the voltage on node D when transistors 310a and 310b are turned OFF, as shown by plots 722 and 724 in FIG. 7.

At time $T_3$, the En1 control signal is brought to logic high, the En2 control signal is brought to logic low, and transistors 418a, 418b, and 422 are turned ON. Inverters 412a and 412b within sense circuit 410x are then enabled. Inverters 412a and 412b then detect the voltage difference between nodes M and D and further amplify the detected voltage difference. If there was a match, then the voltage on node D will be higher than the voltage on node M (as shown by plots 712 and 714 in FIG. 7), the outputs of inverters 412b (node F) and 412a (node G) will be driven to logic high and logic low, respectively, and the Out A and Out B outputs will be driven to logic low and logic high, respectively. Conversely, if there was a mismatch, then the voltage on node M will be higher than the voltage on node D (as shown by plots 722 and 724 in FIG. 7), the outputs of inverters 412b (node F) and 412a (node G) will be driven to logic low and logic high, respectively, and the Out A and Out B outputs will be driven to logic high and logic low, respectively.

Starting at time $T_3$, transistors 418a and 418b respectively pull common lines 610a and 610b toward $V_{SS}$. Transistors 418a and 418b should be turned ON long enough to pull the voltage on these common lines to near $V_{SS}$, to prepare for the next sensing cycle.

Match line detection mechanism 600 is a different approach in comparison to match line detection mechanism 400 in FIG. 4A. Detection mechanisms 400 and 600 may be operated at a higher clock speed since it is not necessary to completely pre-charge the match line to $V_{DD}$ and also not necessary pull the match line to $V_{DD}$ or $V_{SS}$ after the pre-charge period (after the Pch signal has transitioned to logic high). This is because the differential sensing mechanism 410x can detect a small voltage difference between nodes D and M. Match line detection mechanisms 400 and 600 also achieve low power operation since the match line and dummy line operate with a small voltage swing rather than a full swing from $V_{SS}$ to $V_{DD}$.

The sense circuits described herein may be used to detect the signal on a match line coupled to a row of "ternary" CAM cells. A ternary CAM cell is one that includes two memory cells or storage elements, with one cell being used to store a data bit and the other cell being used to store a control bit to indicate whether or not a comparison is to be performed for that CAM cell. The additional (or secondary) cell may thus be used to selectively enable or disable the ternary CAM cell from being used in the comparison. If the ternary CAM cell is disabled, then its output does not affect the logic level on the match line to which it is coupled.

Figure 8A:
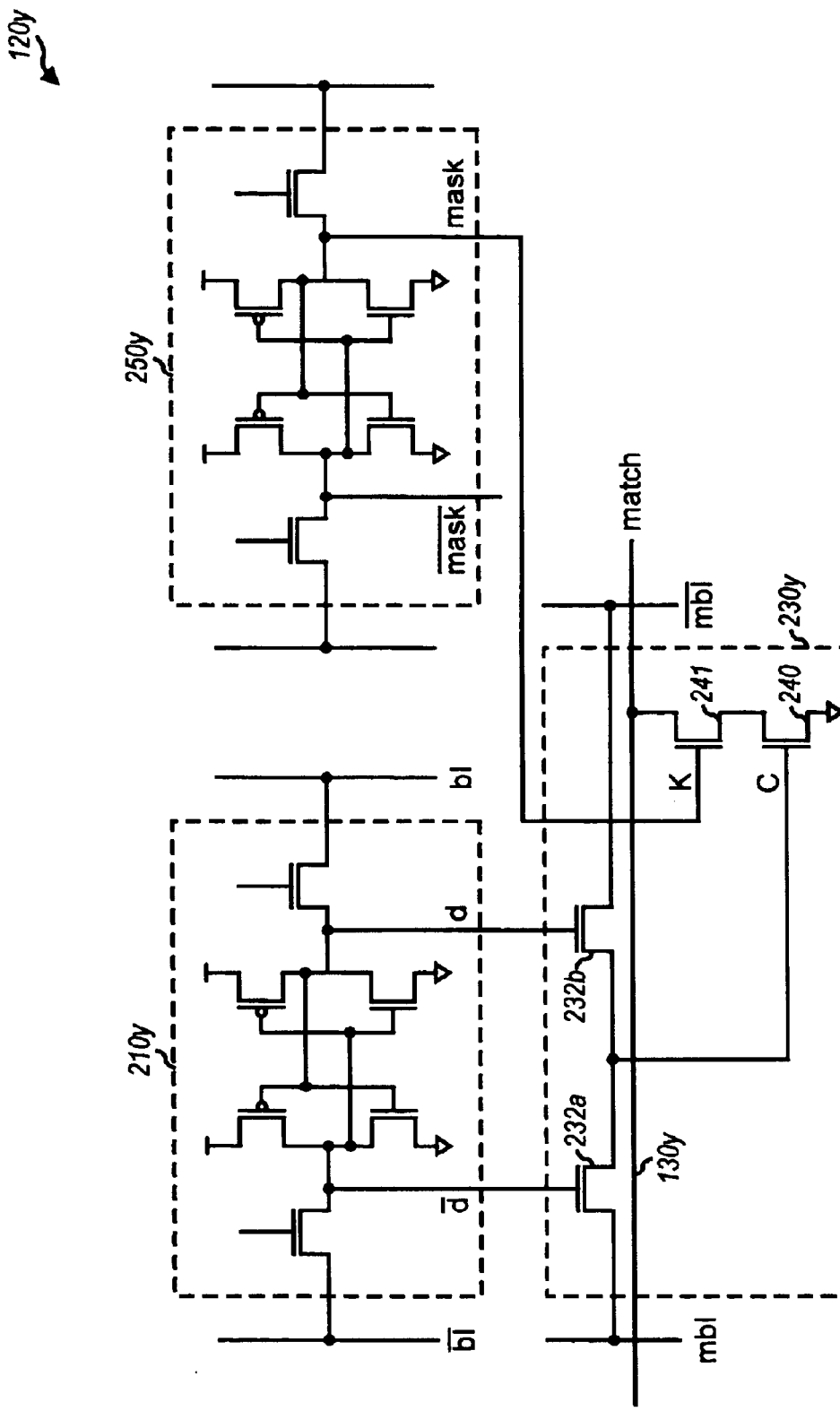
FIG. 8A is a schematic diagram of an embodiment of a conventional ternary CAM cell.

FIG. 8A is a schematic diagram of an embodiment of a conventional ternary CAM cell 120y, which may be used for each of the CAM cells 120 in FIG. 1A. CAM cell 120y includes a memory cell 210y, a secondary cell 250y, and a comparison circuit 230y. Memory cell 210y operates in similar manner as that described above for memory cell 210x in FIG. 2B and is used to store a single data bit. Secondary cell 250y is similar in design to memory cell 210y and is used to store a single control bit. Secondary cell 250y may be programmed in similar manner as for memory cell 210y, and may further utilize the same bit line (bl and $\overline{bl}$).

Comparison circuit 230y comprises a pair of N-channel transistors 232a and 232b and a pair of N-channel output transistors 240 and 241. Transistors 232a and 232b are coupled to memory cell 210y in similar manner as shown in FIG. 2B for CAM cell 120x. Output transistors 240 and 241 are coupled in series and to cells 210y and 250y. In particular, output transistor 241 has its drain coupled to a match line 130y for the row to which CAM cell 120y belongs, its source coupled to the drain of transistor 240, and its gate (labeled as node "K") coupled to the mask line from secondary cell 250y. Output transistor 240 has its source coupled to circuit ground (e.g., $V_{SS}$) and its gate (labeled as node "C") coupled to the drains of transistors 232a and 232b. Output transistors 240 and 241 effectively implement a NAND gate.

Comparison circuit 230y operates as follows. If the address bit is not the same as the stored data bit in memory cell 210y, then node C will be at logic high to indicate a mismatch. If the control bit on the mask line is at logic high, indicating that the ternary CAM cell is enabled, then node K will also be at logic high. If nodes C and K are both at logic high, then output transistors 240 and 241 are both turned ON, and match line 130y is pulled to logic low (e.g., toward $V_{SS}$). Otherwise, if node C is at logic low because of a match or node K is at logic low because the ternary CAM cell is disabled, then one or both of the output transistors will be turned OFF and these transistors will not actively operate on match line 130y. Thus, comparison circuit 230y of ternary CAM 120y cell only pulls the match line to logic low if the CAM cell is enabled for comparison and there was a mismatch between its data bit and the address bit.

Figure 8B:
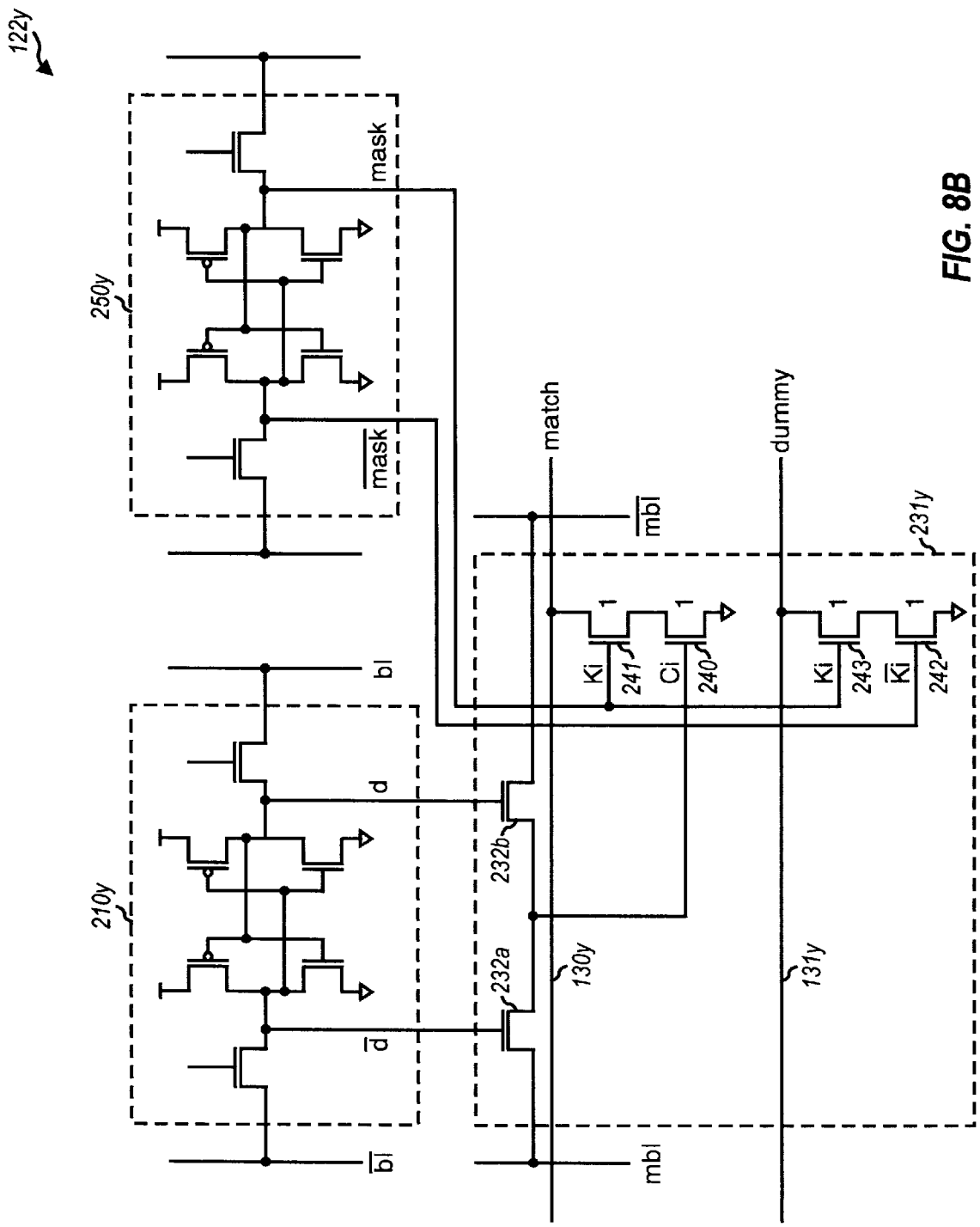
FIG. 8B is a schematic diagram of a ternary CAM cell having improved performance.

FIG. 8B is a schematic diagram of an embodiment of a ternary CAM cell 122y, which may be used for each of the CAM cells 122 in FIG. 1B. CAM cell 120y includes a memory cell 210y, a secondary cell 250y, and a comparison circuit 231y. Memory cell 210y and secondary cell 250y operate in similar manner as that described above for ternary CAM cell 120y in FIG. 8A, and are used to store a single data bit and a single control bit, respectively. Comparison circuit 231y comprises the pair of N-channel transistors 232a and 232b and the pair of N-channel output transistors 240 and 241, which are coupled in similar manner as described above in FIG. 8A. Comparison circuit 231y further comprises a pair of N-channel dummy transistors 242 and 243, which are coupled in series and to dummy line 131y. In particular, dummy transistor 243 has its drain coupled to dummy line 131y for the row to which CAM cell 120y belongs, its source coupled to the drain of transistor 242, and its gate (labeled as node "$\overline{Ki}$") coupled to the inverted mask output of secondary cell 250y. Dummy transistor 242 has its source coupled to circuit ground (e.g., $V_{SS}$) and its gate (labeled as node "Ki") coupled to the mask output of secondary cell 250y. Dummy transistors 242 and 243 provide the proper loading for dummy line 131y. Dummy transistors 242 and 243 have similar physical dimension as output transistors 240 and 241. In an embodiment, dummy transistors 242 and 243 are located near output transistors 240 and 241 and are oriented in the same direction. The output of the pair of dummy transistors 242 and 243 is always OFF since the gate inputs are complementary.

Figure 8C:
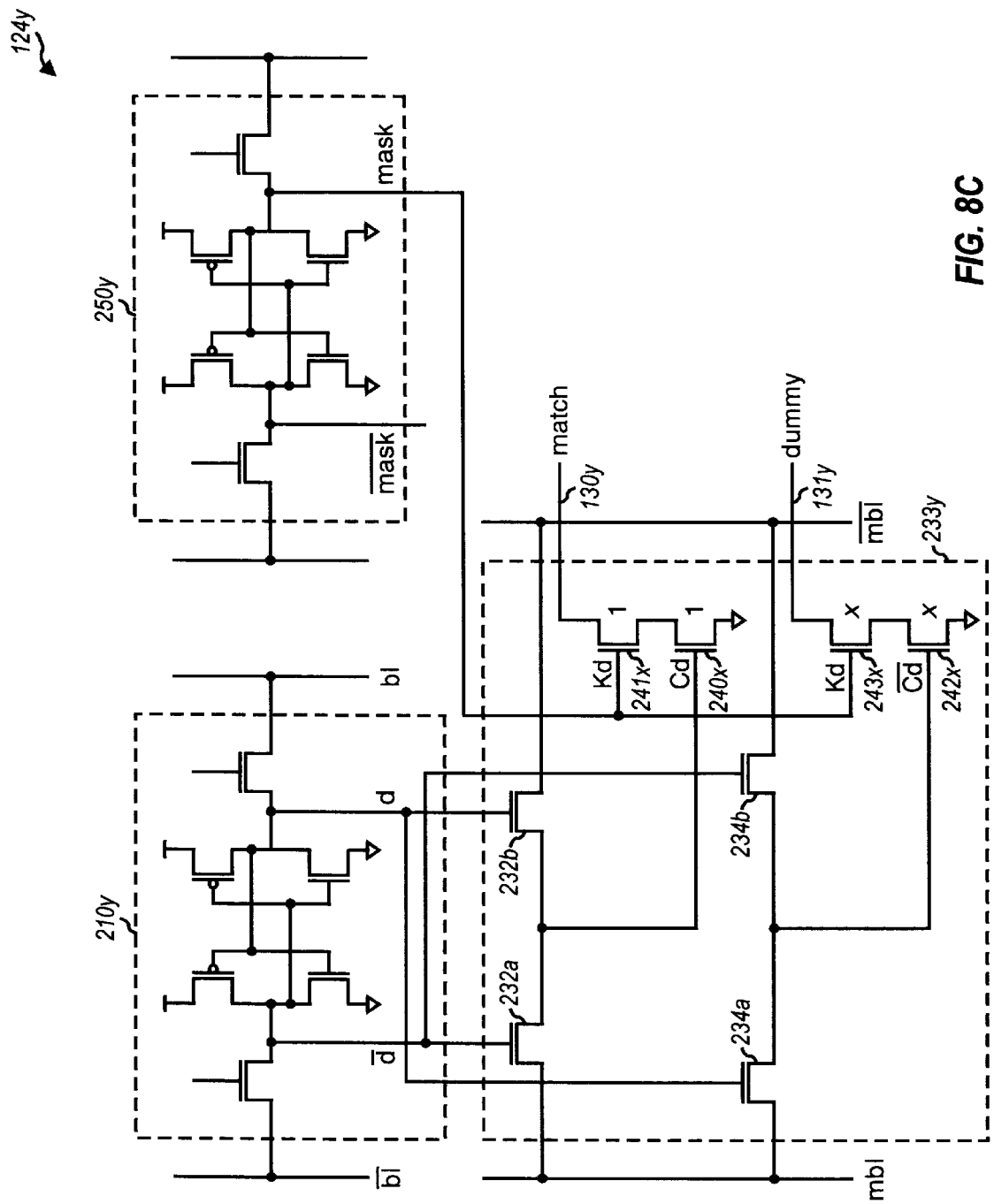
FIG. 8C is a schematic diagram of a dummy ternary CAM cell.

FIG. 8C is a schematic diagram of an embodiment of a dummy ternary CAM cell 124y, which may be used for each of the dummy CAM cells 124 in FIG. 1B. Dummy CAM cell 124y includes a memory cell 210y, a secondary cell 250y, and a comparison circuit 233y. Memory cell 210y and secondary cell 250y operate in similar manner as that described above for ternary CAM cell 120y in FIG. 8A, and are used to store a single data bit and a single control bit, respectively.

Comparison circuit 233y includes circuitry used to drive match line 130y and dummy line 131y. In particular, comparison circuit 233y comprises transistors 232a, 232b, and output transistors 240x and 241x coupled in the manner described above with reference to FIG. 8A and used to drive match line 130y. Comparison circuit 233y further comprises a second pair of N-channel transistors 234a and 234b and a second pair of output transistors 242x and 243x used to drive dummy line 131y. Transistors 234a and 234b and output transistors 242x and 243x are coupled in similar manner as transistors 232a and 232b and output transistors 240x and 241x for the match line, except that the gates of transistors 234a and 234b couple to the data line (d) and the complementary data line ($\overline{d}$), respectively.

The output of the pair of transistors 240x and 241x and the output of the pair of transistors 242x and 243x are complementary. When the output of transistor pair 240x and 241x is OFF, the output of transistor pair 242x and 243x is ON and pulls down the dummy line with fraction of the speed as that of the match line if there is at least one bit mismatch. Conversely, when the output of transistor pair 242x and 243x is OFF, the dummy line will not be pulled down. But the output of transistor pair 240x and 241x will be ON and the match line will be pulled down. This would then indicate a mismatch and this row is disabled.

Figure 9A:
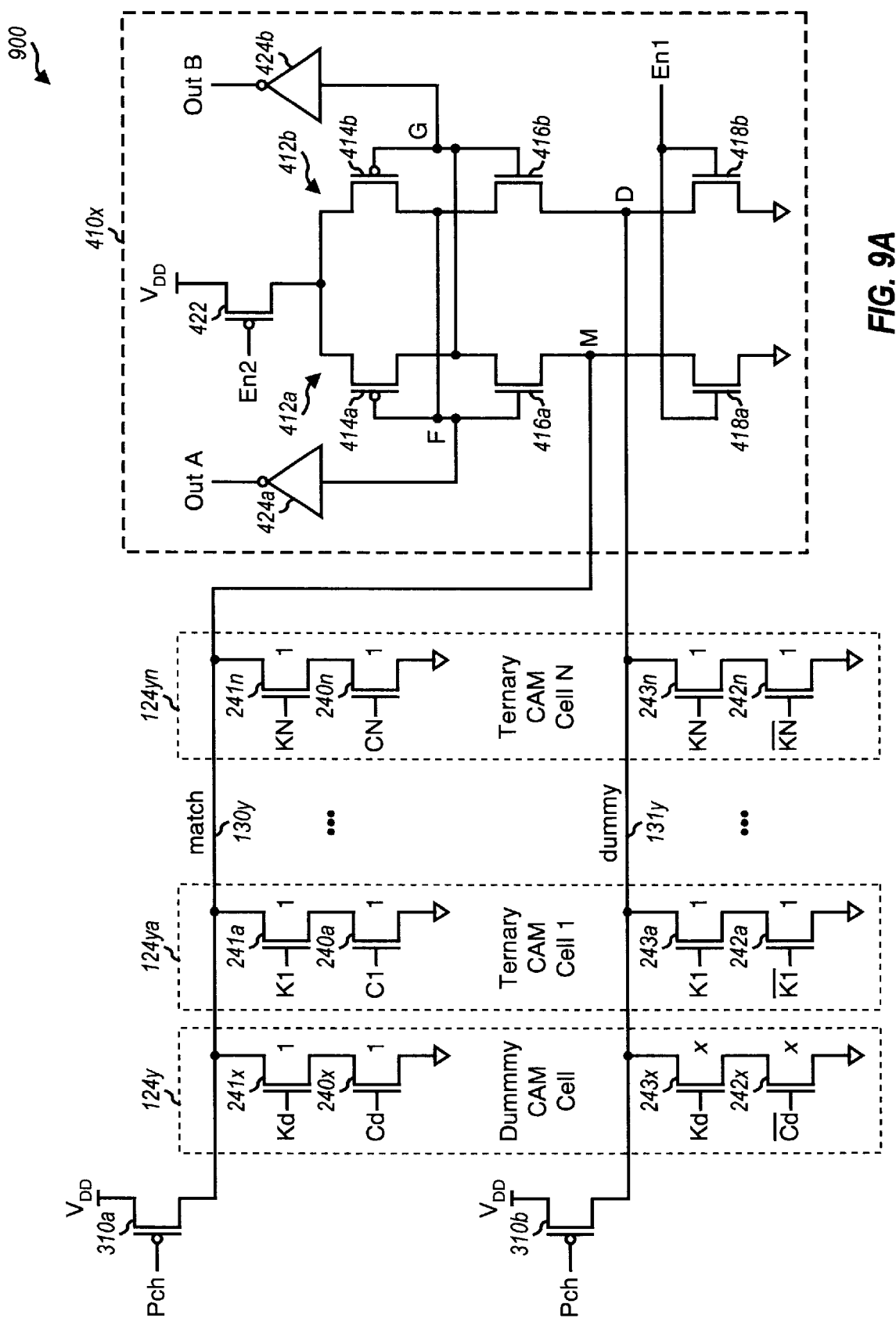
FIGS. 9A, 9B, and 10 are schematic diagrams of three match line detection mechanisms for ternary CAM cells.

FIG. 9A is a schematic diagram of a match line detection mechanism 900, which may be used in conjunction with ternary CAM cells 122y and 124y in CAM unit 100b in FIG. 1B, in accordance with yet another embodiment of the invention. Similar to FIG. 4A, a match line 130y couples to N pairs of output transistors 240a and 241a through 240n and 241n for the N ternary CAM cells 124ya through 124yn and also to transistors 240x and 241x for dummy CAM cell 124y in a specific row of the CAM array. The gates of output transistors 240a through 240n couple to the comparison circuit outputs (labeled as C1 through CN) for the N ternary CAM cells, and the gates of output transistors 241a through 241n couple to the mask outputs (labeled as K1 through KN) of the secondary cells for the N ternary CAM cells. The gates of output transistors 240x and 241x respectively couple to the comparison circuit outputs (labeled as Cd) and the secondary cell inverted mask output (labeled as $\overline{Kd}$) for dummy ternary CAM cell 124y. Match line 130y further couples to P-channel transistor 310a and a first input of a sense circuit 410y, which is used to sense the signal on the match line.

Dummy line 131y couples to N pairs of dummy transistors 242a and 243a through 242n and 243n for the N ternary CAM cells 124ya through 124yn and also to transistors 242x and 243x for dummy CAM cell 124y within the same row as the associated match line 130y. The gates of dummy transistors 242a through 242n couple to the inverted mask outputs of the secondary cells, and the gates of dummy transistors 243a through 243n couple to the mask outputs of the secondary cells. With this connection, the N pairs of dummy transistors 242a and 243a through 242n and 243n are always turned OFF. The gates of dummy transistors 242x and 243x are respectively coupled to the comparison circuit complementary output (labeled as $\overline{Cd}$) and the mask output (labeled as Kd) for dummy ternary CAM cell 124y. This dummy transistor pair is turned ON. Again, transistors 242x and 243x are dimensioned to be a fraction (e.g., half) of the size of the other output transistors. Dummy line 131y further couples to P-channel transistor 310b and the second input (node D) of a sense circuit 410y.

In the specific embodiment shown in FIG. 9A, sense circuit 410x includes inverters 412a and 412b, N-channel transistors 418a and 418b, P-channel transistor 422, and inverting buffers 424a and 424b, which are coupled together as described above for sense circuit 410x in FIG. 4A.

Sense circuit 410x may be used to detect the signal on match line 130y in similar manner as that described above for detection mechanism 400 in FIG. 4A and shown by the timing diagram in FIG. 5.

Figure 9B:
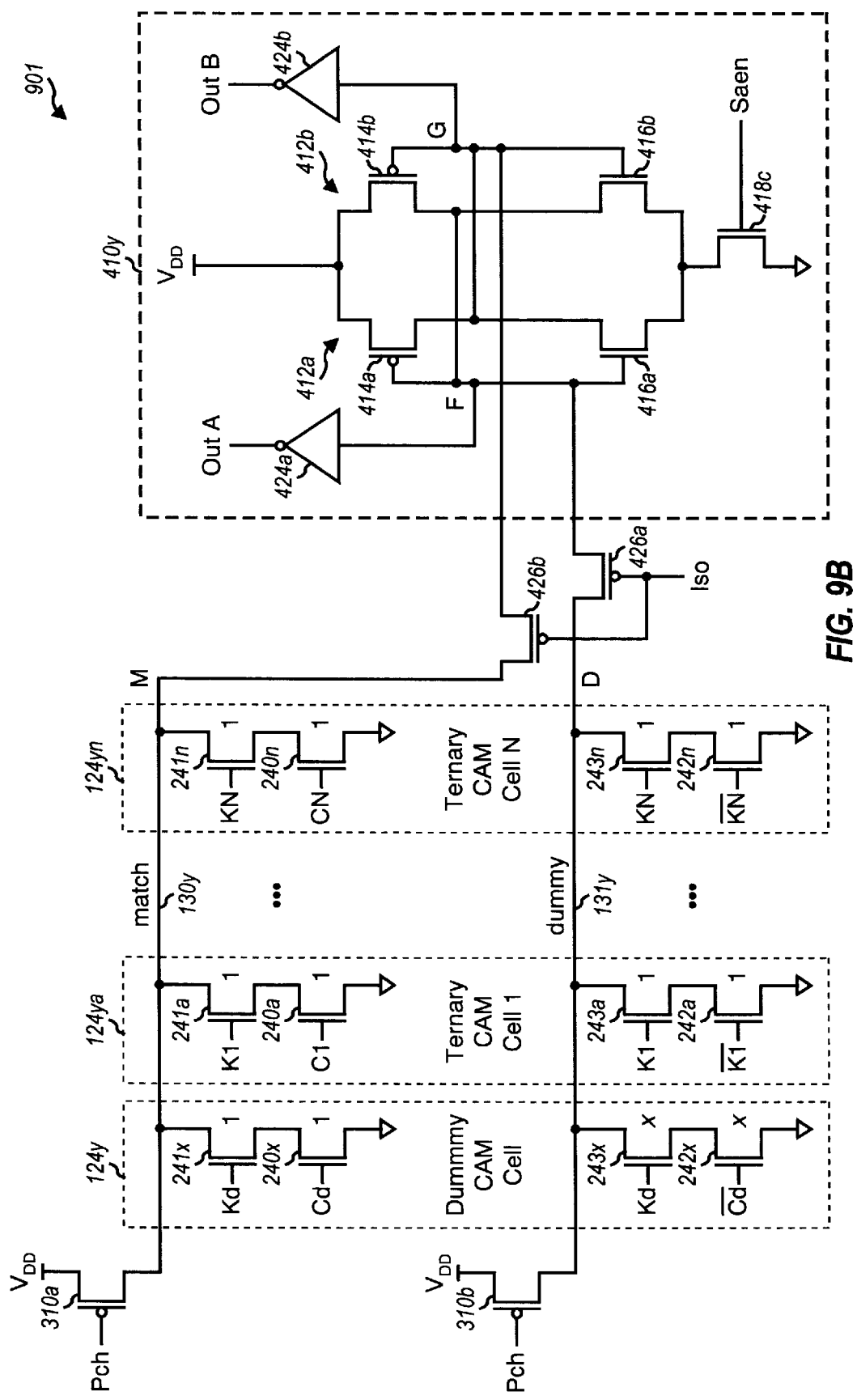

FIG. 9B is a schematic diagram of a match line detection mechanism 901, which may also be used in conjunction with ternary CAM cells 122y and 124y in CAM unit 100b. Match line detection mechanism 901 is similar to match line detection mechanism 900 in FIG. 9A. However, match line 130y further couples to P-channel pass transistor 426b and dummy line 131y further couples to P-channel pass transistor 426a. Pass transistors 426a and 426b respectively couple the dummy and match lines to sense circuit 410y, similar to the embodiment shown in FIG. 4B. The operation of match line detection mechanism 901 is as described above for FIGS. 4B and 9A.

Figure 10:
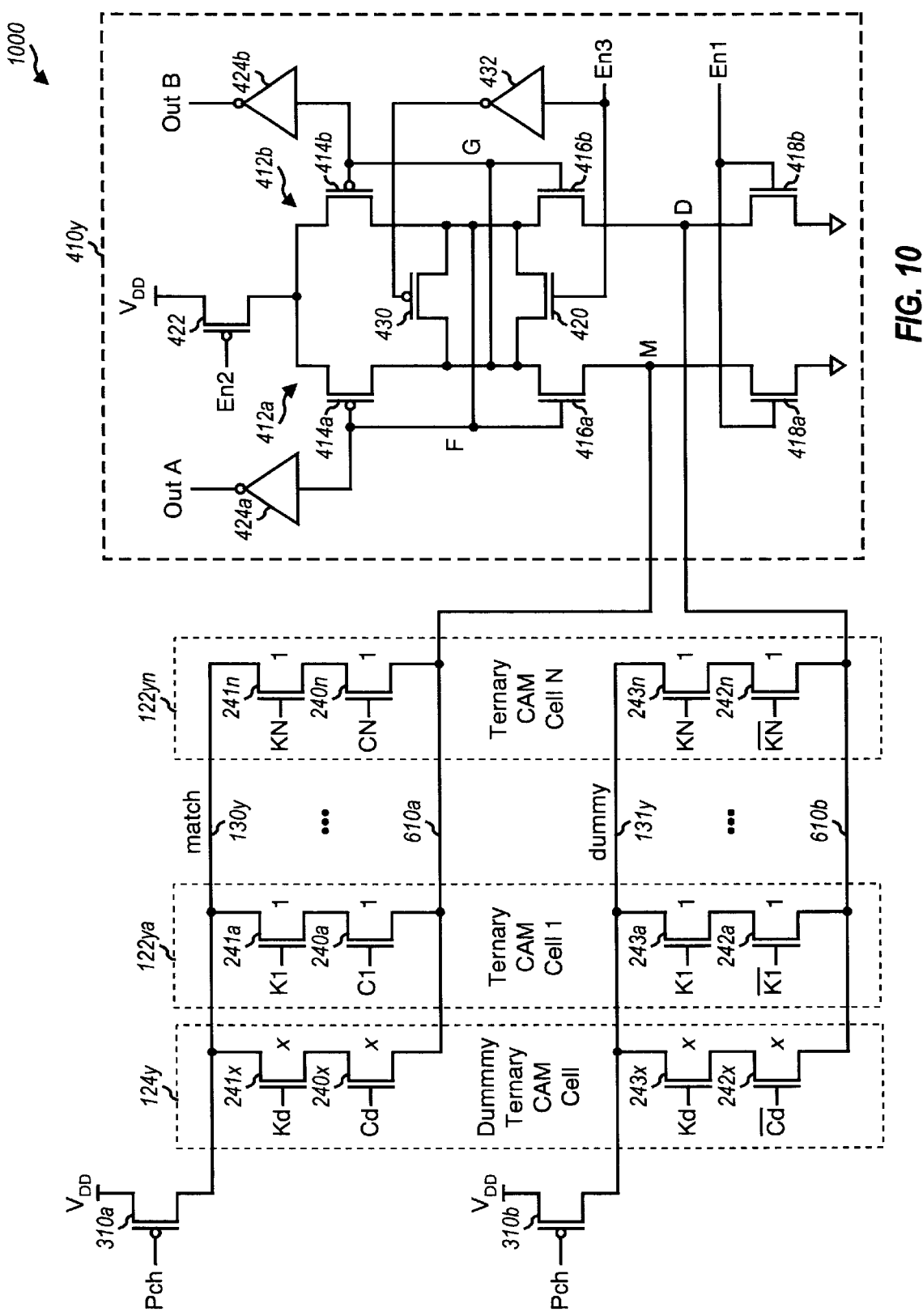

FIG. 10 is a schematic diagram of a match line detection mechanism 1000, which may be used in conjunction with ternary CAM cells 122y and 124y in CAM unit 100b in FIG. 1B, in accordance with yet another embodiment of the invention. Similar to FIGS. 6 and 9, match line 130y couples to N pairs of output transistors 240a and 241a through 240n and 241n for the N ternary CAM cells 122 and also to output transistors 240x and 241x for the dummy ternary CAM cell 124 in a specific row of the CAM array. However, the sources of output transistors 241a through 241n are coupled to node M of sense circuit 410y via first common line 610x. Similarly, the sources of dummy transistors 242a through 242n are coupled to node D of sense circuit 410y via second common line 610y.

FIG. 10 also shows an embodiment of a sense circuit 410y. Sense circuit 410y includes inverters 412a and 412b, N-channel transistors 418a and 418b, P-channel transistor 422, and inverting buffers 424a and 424b, which are coupled together as described above for sense circuit 410x in FIG. 4A. Sense circuit 410y further includes an N-channel transistor 420, a P-channel transistor 430, and an inverter 432. P-channel transistor 430 is coupled in parallel with N-channel transistor 420. The sources of transistors 420 and 430 couple to node F, the drains of transistors 420 and 430 couple to node G, the gate of transistor 420 couples to the input of inverter 432, and the gate of transistor 430 couples to the output of inverter 432. The input of inverter 432 couples to an En3 control signal. Transistors 420 and 430 form a switch that shorts out nodes F and G when enabled by the En3 control signal. The transistors 420 and 430 are used to equalize nodes G and F in each cycle before a match comparison. In a typical implementation of all the above embodiments, these two transistors will be provided to equalize nodes F and G before each match comparison.

Sense circuit 410y may be used to detect the signal on common line 610x in similar manner as that described above for detection mechanism 600 in FIG. 6 and shown by the timing diagram in FIG. 7. Sense circuit 410y may also be used for match line detection mechanisms 400, 600, and 900.

For clarity, specific designs of the sense circuit have been described herein. Various modifications to these circuit designs may also be made, and this is within the scope of the invention. For example, for sense circuit 410x, inverters 412a and 412b may be coupled to match line 130x or common line 610x via some other configuration, and so on.

The specific timing diagrams shown in FIGS. 5 and 7 are also provided to illustrate the operation of the sense circuit and the match line detection. Variations to the timing shown in FIGS. 5 and 7 may also be made, and this is within the scope of the invention. For example, the En1 control signal may be brought to logic high at time $T_2$ when the Pch control signal is brought to logic high.

The sense circuits and match line detection mechanisms described herein may be used to provide a CAM array having faster speed of operation and lower power consumption. These circuits may also be used for other types of memory (e.g., dynamic random access memory or DRAM), and other integrated circuits (e.g., microprocessors, controllers, and so on).

The circuits described herein may also be implemented in various semiconductor technologies, such as CMOS, bipolar, bi-CMOS, GaAs, and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A content addressable memory (CAM) cell comprising:
   a memory cell operable to store a bit value; and
   a comparison circuit coupled to the memory cell and configured to detect the bit value stored in the memory cell, the comparison circuit including
      an output transistor coupled to a match line and configured to provide a drive for the match line based on the detected bit value, and
      a dummy transistor coupled to a dummny line and configured to provide a drive for the dummy line based on an inverted detected bit value, wherein the match line and dummy line are used to detect output values provided by other CAM cells also coupled to the match and dummy lines.

2. The CAM cell of claim 1, wherein the comparison circuit further includes
   a first pair of transistors configured to receive the detected bit value and provide a drive for the output transistor, and
   a second pair of transistors configured to receive the inverted detected bit value and provide a drive for the dummy transistor.

3. The CAM cell of claim 1, wherein the dummy transistor has a smaller dimension and less current flowing through than the output transistor and is located in close proximity to the output transistor.

4. The CAM cell of claim 3, wherein the dummy transistor is approximately half the dimension of the output transistor and is turned ON during sensing operation.

5. A content addressable memory (CAM) cell comprising:
   a memory cell operable to store a data bit value;
   a secondary cell operable to store a control bit value and a complementary control bit value; and
   a comparison circuit coupled to the memory cell and the secondary cell and configured to detect the data bit value stored in the memory cell and the control bit value and the complementary control bit value stored in the secondary cell, the comparison circuit including
      a pair of output transistors coupled to a match line and configured to provide a drive for the match line based on the detected data bit value and the detected control bit value, and
      a pair of dummy transistors coupled to a dummy line and configured to provide a drive for the dummy line based on the detected control bit value and the detected complementary control bit value,
   wherein the match line and the dummy line are used to detect an output value provided by the CAM cell.

6. The CAM cell of claim 5, wherein the dummy transistors have similar dimensions and orientation as the output transistors and located in close proximity to the output transistors.

7. The CAM cell of claim 5, wherein an output of the pair of dummy transistors are OFF during sensing operation.

8. A content addressable memory (CAM) cell comprising:
a memory cell operable to store a data bit value;
a secondary cell operable to store a control bit value; and
a comparison circuit coupled to the memory cell and the secondary cell and configured to detect the data bit value stored in the memory cell and the control bit value stored in the secondary cell, the comparison circuit including
a pair of output transistors coupled to a match line and configured to provide a drive for the match line based on the detected data bit value and the detected control bit value, and
a pair of dummy transistors coupled to a dummy line and configured to provide a drive for the dummy line based on an inverted detected data bit value and the detected control bit value.

9. The CAM cell of claim 8, wherein the comparison circuit further includes
a first pair of transistors configured to receive the detected data bit value and provide a drive for a first output transistor, and
a second pair of transistors configured to receive the inverted detected bit value and provide a drive for a first dummy transistor.

10. The CAM cell of claim 8, wherein the dummy transistors have smaller dimension and less current flowing through than the output transistors, are located in close proximity to the output transistors, and are turned ON during sensing operation.

11. The CAM cell of claim 10, wherein the dummy transistors are approximately half the dimension of the output transistors.

12. A sense circuit for sensing a logic state of a match line in a content addressable memory (CAM), comprising:
a plurality of dummy transistors operative to provide a reference signal;
a first amplifier having an input operatively coupled to the match line, wherein the match line is coupled to a plurality of output transistors for a plurality of CAM cells, each output transistor providing an output value indicative of a comparison result for a respective CAM cell; and
a second amplifier having an input configured to receive the reference signal, wherein the first and second amplifiers are coupled in a positive feedback configuration and operative to amplify a difference between a signal on the match line and the reference signal,
wherein the plurality of output transistors are N-channel transistors having drains that couple to the match line and sources that couple to a first common line, and wherein the input of the first amplifier is coupled to the first common line.

13. The sense circuit of claim 12, wherein the plurality of dummy transistors are N-channel transistors having drains that couple to a dummy line and sources that couple to a second common line, and wherein the input of the second amplifier is coupled to the second common line.

14. The sense circuit of claim 13, wherein the match line and the dummy line are pre-charged prior to being sensed by the sense circuit.

15. A sense circuit for sensing a logic state of a match line in a content addressable memory (CAM), comprising:
a plurality of dummy transistors operative to provide a reference signal;
a first amplifier having an input operatively coupled to the match line, wherein the match line is coupled to a plurality of pairs of output transistors for a plurality of CAM cells, each pair of output transistors providing an output value indicative of a comparison result for a respective CAM cell; and
a second amplifier having an input configured to receive the reference signal, wherein the first and second amplifiers are coupled in a positive feedback configuration and operative to amplify a difference between a signal on the match line and the reference signal,
wherein each pair of output transistors comprises a pair of series-coupled N-channel transistors having one drain coupled to the match line and one source coupled to a first common line, and wherein the input of the first amplifier is coupled to the first common line.

16. The sense circuit of claim 15, wherein the plurality of dummy transistors comprise a plurality of pairs of series-coupled N-channel dummy transistors, each pair of dummy transistors having one drain coupled to a dummy line and one source coupled to a second common line, and wherein the input of the second amplifier is coupled to the second common line.

17. A method for sensing a logic state of a match line in a content addressable memory (CAM), comprising:
sensing a signal on a first common line, wherein the signal on the first common line is related to a signal on the match line;
providing a reference signal on a second common line based on a plurality of dummy transistors;
determining a difference between the sensed signal on the first common line and the reference signal on the second common line;
amplifying the determined difference with a positive feedback amplifier; and
providing an output value indicative of the logic state of the match line based on the amplified difference.

* * * * *